(12) United States Patent
Forrest et al.

(10) Patent No.: US 9,847,487 B2
(45) Date of Patent: Dec. 19, 2017

(54) USE OF INVERSE QUASI-EPITAXY TO MODIFY ORDER DURING POST-DEPOSITION PROCESSING OF ORGANIC PHOTOVOLTAICS

(71) Applicant: THE REGENTS OF THE UNIVERSITY OF MICHIGAN, Ann Arbor, MI (US)

(72) Inventors: Stephen R. Forrest, Ann Arbor, MI (US); Jeramy D. Zimmerman, Golden, CO (US); Brian E Lassiter, San Francisco, CA (US); Xin Xiao, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/646,136

(22) PCT Filed: Nov. 22, 2013

(86) PCT No.: PCT/US2013/071451
§ 371 (c)(1),
(2) Date: May 20, 2015

(87) PCT Pub. No.: WO2014/082002
PCT Pub. Date: May 30, 2014

(65) Prior Publication Data
US 2015/0318505 A1 Nov. 5, 2015

Related U.S. Application Data

(60) Provisional application No. 61/729,374, filed on Nov. 22, 2012, provisional application No. 61/769,661, filed on Feb. 26, 2013.

(51) Int. Cl.
*H01L 51/00* (2006.01)
*H01L 51/42* (2006.01)
*B82Y 10/00* (2011.01)

(52) U.S. Cl.
CPC .......... *H01L 51/0026* (2013.01); *B82Y 10/00* (2013.01); *H01L 51/001* (2013.01);
(Continued)

(58) Field of Classification Search
CPC .............. H01L 51/001; H01L 51/0003; H01L 51/0026; H01L 51/0028; H01L 51/0046; H01L 51/0059
See application file for complete search history.

(56) References Cited

U.S. PATENT DOCUMENTS

2012/0248419 A1   10/2012   Thompson et al.

FOREIGN PATENT DOCUMENTS

WO    WO 2011/127186 A1 *  10/2011   ............ H01L 51/42
WO    WO2011/127186 A1    10/2011

OTHER PUBLICATIONS

Wei et al. "Functionalized Squaraine Donors for Nanocrystalline Organic Photovoltaics" ACS Nano, vol. 6, No. 1, 972-978, published online Dec. 23, 2011.*
(Continued)

*Primary Examiner* — Whitney T Moore
*Assistant Examiner* — Joseph Galvin, III
(74) *Attorney, Agent, or Firm* — Finnegan, Henderson, Farabow, Garrett & Dunner L.L.P.

(57) ABSTRACT

Disclosed herein are methods for fabricating an organic photovoltaic device comprising depositing an amorphous organic layer and a crystalline organic layer over a first electrode, wherein the amorphous organic layer and the crystalline organic layer contact one another at an interface; annealing the amorphous organic layer and the crystalline
(Continued)

organic layer for a time sufficient to induce at least partial crystallinity in the amorphous organic layer; and depositing a second electrode over the amorphous organic layer and the crystalline organic layer. In the methods and devices herein, the amorphous organic layer may comprise at least one material that undergoes inverse-quasi epitaxial (IQE) alignment to a material of the crystalline organic layer as a result of the annealing.

29 Claims, 10 Drawing Sheets

(52) U.S. Cl.
 CPC ...... *H01L 51/0003* (2013.01); *H01L 51/0028* (2013.01); *H01L 51/0046* (2013.01); *H01L 51/0059* (2013.01); *H01L 51/0062* (2013.01); *H01L 51/4253* (2013.01); *H01L 51/0053* (2013.01); *Y02E 10/549* (2013.01)

(56) References Cited

OTHER PUBLICATIONS

Wei et al. "Functionalized Squaraine Donors for Nanocrystalline Organic Photovoltaics" ACS Nano, vol. 6, No. 1,972-978, published online Dec. 23, 2011.*

International Preliminary Report on Patentability, PCT/US2013/071451, dated May 26, 2015.

Zimmerman et al., *Independent Control of Bulk and Interfacial Morphologies of Small Molecular Weight Organic Heterojunction Solar Cells*, Nano Letters, vol. 12, No. 8, pp. 4366-4371 (Jul. 18, 2012).

Drees et al., *Enhanced Photovoltaic Efficiency in Polymer-Fullerene Composites by Thermally Controlled Interdiffusion*, Proceedings of SPIE, SPIE International Society for Optical Engineers, US, vol. 5215, No. 1, pp. 89-98 (Aug. 8, 2003).

Xiao et al., *Small-Molecule Photovoltaics Based on Functionalized Squaraine Donor Blends*, Advanced Materials 2012, vol. 24, Issue 15, pp. 1956-1960 (Mar. 26, 2012).

Wei et al., *Efficient, Ordered Bulk Heterojunction Nanocrystalline Solar Cells by Annealing of Ultrathin Squaraine Thin Films*, NANO Lett., vol. 10, No. 9, pp. 3555-3559 (2010).

Wei et al., *Solvent-Annealed Crystalline Squaraine: $PC_{70}BM$ (1:6) Solar Cells*, Adv. Energy Mater., vol. 1, No. 2, pp. 184-187 (2011).

Zimmerman et al., *Control of interface Order by Inverse Quasi-Epitaxial Growth of Squaraine/Fullerene Thin Film Photovoltaics*, ACS NANO, vol. 7, No. 10, pp. 9268-9275 (2013).

* cited by examiner

USE OF INVERSE QUASI-EPITAXY TO MODIFY ORDER DURING POST-DEPOSITION PROCESSING OF ORGANIC PHOTOVOLTAICS

CROSS-REFERENCE TO RELATED APPLICATION

This application claims the benefit of U.S. Provisional Application No. 61/729,374, filed Nov. 22, 2012, and U.S. Provisional Application No. 61/769,661, filed Feb. 26, 2013, both of which are incorporated herein by reference in their entirety.

STATEMENT REGARDING FEDERALLY SPONSORED RESEARCH

This invention was made with U.S. Government support under Contract Nos. DE-SC0000957 and DE-EE0005310 awarded by the Department of Energy. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and Global Photonic Energy Corporation. The agreement was in effect on and before the date the subject matter of the present disclosure was prepared, and was made as a result of activities undertaken within the scope of the agreement.

The present disclosure generally relates to organic photovoltaics, in particular, methods of fabricating organic photovoltaics using post-deposition processing.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, open-circuit voltage, or $V_{OC}$. When irradiated with its electrical contacts shorted, a PV device generates its maximum possible current, short-circuit current, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC}$×$V_{OC}$. When the load value is optimized for maximum power extraction, the current and voltage have the values, $I_{max}$ and $V_{max}$, respectively.

A figure of merit for PV devices is the fill factor, FF, defined as:

$$FF=\{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P=FF*(I_{SC}*V_{OC})/P_{inc}$$

To produce internally generated electric fields that occupy a substantial volume of the semiconductor, the usual method is to juxtapose two layers of material (donor and acceptor) with appropriately selected conductive properties, especially with respect to their distribution of molecular quantum energy states. The interface of these two materials is called a photovoltaic junction. In traditional semiconductor theory, materials for forming PV junctions have been denoted as generally being of either n- or p-type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

A significant property in organic semiconductors is carrier mobility. Mobility measures the ease with which a charge carrier can move through a conducting material in response to an electric field. In the context of organic photosensitive devices, a layer including a material that conducts preferentially by electrons due to high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction also plays an important role.

The energy level offset at an organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency $\eta$ associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P\sim\eta_{EXT}=\eta_A*\eta_{ED}*\eta_{CC}$$

$$\eta_{EXT}=\eta_A*\eta_{INT}$$

The diffusion length ($L_D$) of an exciton is typically much less ($L_D$~50 Å) than the optical absorption length (~500 Å), requiring a tradeoff between using a thick, and therefore resistive, cell with multiple or highly folded interfaces, or a thin cell with a low optical absorption efficiency.

Organic PV cells have many potential advantages when compared to traditional silicon-based devices. Organic PV cells are light weight, economical in materials use, and can be deposited on low cost substrates, such as flexible plastic foils. The reported efficiencies of some of the best organic PVs are around 10%. For commercialization, further device designs and fabrication techniques should be considered.

Molecular materials form a large class of substances known as "van der Waals solids" due to the eponymously-named bond forces that are largely responsible for their intermolecular adhesion. The intrinsic weakness of this bond leads to a low elastic modulus, and when deposited onto a surface, a relatively low adhesive energy between the molecular film and the substrate. The resulting low strain energy between film and substrate allows formation of nano- to macro-crystalline self-organized growth of films that are registered, but not inherently closely lattice matched to the substrate. This is in stark contrast to the growth of more strongly bonded covalent or ionic solids where, in the absence of near-perfect lattice matching, highly defected and disrupted morphologies result. When the lattice constants of the molecular film approximately fit to those of the substrate, oriented crystalline films covering large areas can be achieved. The relaxation of the requirement for precise lattice registration between film and substrate results in so-called "quasi-epitaxial" growth.

It has been proposed that interface morphology affects the recombination rate for electrons and holes at donor-acceptor heterojunctions in thin film organic photovoltaic cells. The optimal morphology is one where there is disorder at the heterointerface and order in the bulk of the thin films, maximizing both the short circuit current and open circuit voltage.

Thus, disclosed herein are novel methods utilizing quasi-epitaxial alignment of a deposited amorphous organic layer to the lattice of a deposited crystalline organic layer when entropy is introduced into the system by annealing. As described herein, this process is called "inverse quasi-epitaxy" since alignment is initiated at a buried interface and proceeds throughout the previously deposited layers. This is distinct from conventional epitaxy processes whereby growth and registration to the substrate lattice occur during deposition at a free surface.

One embodiment disclosed herein is a method for fabricating an organic photovoltaic device comprising: depositing an amorphous organic layer and a crystalline organic layer over a first electrode, wherein the amorphous organic layer and the crystalline organic layer contact one another at an interface; annealing the amorphous organic layer and the crystalline organic layer for a time sufficient to induce at least partial crystallinity in the amorphous organic layer; and depositing a second electrode over the amorphous organic layer and the crystalline organic layer. In some embodiments, the amorphous organic layer and the crystalline organic layer comprise different small molecule materials.

In some embodiments, the annealing is chosen from solvent vapor annealing and thermal annealing.

In some embodiments, the amorphous organic layer comprises at least one material that undergoes inverse-quasi epitaxial (IQE) alignment to a material of the crystalline organic layer as a result of the annealing. In some embodiments, the at least one material that undergoes IQE alignment is a donor relative to the material of the crystalline organic layer. In other embodiments, the at least one material that undergoes IQE alignment is an acceptor relative to the material of the crystalline organic layer. In certain embodiments, the at least one material that undergoes IQE alignment comprises a squaraine or derivative thereof. In some embodiments, the material of the crystalline organic layer comprises a fullerene or a derivative thereof.

In some embodiments, the at least one material that undergoes IQE alignment exhibits a lattice mismatch to a material of the crystalline organic layer in at least one crystal direction and crystal dimension of less than 10%, upon crystallization. In some embodiments, the at least one material that undergoes IQE alignment exhibits a lattice mismatch to a material of the crystalline organic layer in at least one crystal direction and crystal dimension of less than 5%, upon crystallization. In some embodiments, the at least one material that undergoes IQE alignment exhibits a lattice mismatch to a material of the crystalline organic layer in at least one crystal direction and crystal dimension of less than 1%, upon crystallization.

In some embodiments, the amorphous organic layer further comprises at least one material that does not undergo IQE alignment to the material of the crystalline organic layer as a result of the annealing. In some embodiments, the at least one material that undergoes IQE alignment and the at least one material that does not undergo IQE alignment are donors relative to the material of the crystalline organic layer. In other embodiments, the at least one material that undergoes IQE alignment and the at least one material that does not undergo IQE alignment are acceptors relative to the material of the crystalline organic layer. In certain embodiments, the at least one material that undergoes IQE alignment and the at least one material that does not undergo IQE alignment comprise different squaraine compounds or derivatives thereof.

In some embodiments, the method further comprises depositing a buffer layer over the amorphous organic layer and the crystalline organic layer before performing the annealing such that the buffer layer is also exposed to the annealing.

In some embodiments, the amorphous organic layer and the crystalline organic layer are deposited using different deposition techniques. In certain embodiments, the amorphous organic layer is deposited using a solution processing technique and the crystalline organic layer is deposited using a vacuum deposition technique.

Also disclosed herein is a method of intermixing materials at an interface, comprising providing a film comprising an organic layer and a crystalline organic layer disposed over a substrate, wherein the organic layer contacts the crystalline organic layer at the interface; and annealing the amorphous organic layer and the crystalline organic layer.

In some embodiments, the annealing is chosen from solvent vapor annealing and thermal annealing.

In some embodiments, the organic layer is crystalline. In some embodiments, the organic layer is amorphous. In some embodiments, the organic layer is amorphous and comprises at least one material that undergoes inverse-quasi epitaxial (IQE) alignment to a material of the crystalline organic layer as a result of the annealing. In some embodiments, the amorphous organic layer further comprises at least one material that does not undergo IQE alignment to the material of the crystalline organic layer as a result of the annealing.

In some embodiments, the at least one material that undergoes IQE alignment is a donor relative to the material of the crystalline organic layer. In some embodiments, the at least one material that undergoes IQE alignment is an acceptor relative to the material of the crystalline organic layer. In some embodiments, the at least one material that undergoes IQE alignment and the at least one material that does not undergo IQE alignment are donors relative to the material of the crystalline organic layer. In some embodiments, the at least one material that undergoes IQE alignment and the at least one material that does not undergo IQE alignment are acceptors relative to the material of the crystalline organic layer. In certain embodiments, the material of the crystalline organic layer comprises a fullerene or a derivative thereof.

In some embodiments, the step of providing a film comprising an organic layer and a crystalline organic layer disposed over a substrate comprises depositing an organic layer and a crystalline organic layer over the substrate, wherein the organic layer and the crystalline organic layer are deposited using different techniques. In certain embodiments, the organic layer is deposited using a solution processing technique and the crystalline organic layer is deposited using a vacuum deposition technique.

In some embodiments, the film further comprises a buffer layer disposed over the organic layer and the crystalline organic layer such that the buffer layer is also exposed to the annealing.

Also disclosed herein is an organic photovoltaic device comprising two electrodes in superposed relation, and a photoactive region positioned between the two electrodes, wherein the photoactive region comprises a donor layer and an acceptor layer forming a donor-acceptor heterojunction, wherein one of the donor layer and the acceptor layer is a crystalline layer and the other of the donor layer and the acceptor layer comprises at least one material that has undergone IQE alignment to a material of the crystalline layer.

In some embodiments, the donor layer and the acceptor layer are annealed. In some embodiments, the annealing is chosen from solvent vapor annealing and thermal annealing.

In some embodiments, the layer that comprises the at least one material that has undergone IQE alignment further comprises at least one material that has not undergone IQE alignment to the material of the crystalline layer.

In certain embodiments, the at least one material that has undergone IQE alignment comprises a squaraine or derivative thereof.

In certain embodiments, the material of the crystalline layer is a fullerene or derivative thereof.

The accompanying figures are incorporated in, and constitute a part of this specification.

FIGS. 1(a) and 1(c) show transmission electron micrographs where (a) shows a relatively uniform morphology in a spherulite, and (c) shows mottling in the image of the blend (indicated by arrows) suggesting phase separation; Inset in (a): Nomarski micrograph of a spherulite; Inset in (b): Long-range phase separation as indicated by dendrite formation of a blended squaraine film.

FIGS. 1(b) and 1(d) show selected area electron diffraction (SAED) patterns after SVA, where (b) shows the SAED pattern of DPASQ/$C_{60}$ spherulites indicating single-crystal DPASQ and polycrystalline $C_{60}$ diffraction patterns and the various lattice registrations at the (20), (31), and (32) diffraction conditions (circled), and (d) shows the SAED pattern of the blended squaraine film exhibiting decoration of the $C_{60}$ diffraction patterns with DPASQ crystals.

FIGS. 1(e) and 1(f) show schematic depictions of film structures after SVA of (e) DPASQ/$C_{60}$, and (f) blended squaraine/$C_{60}$. The upper layer (circles) depicts the nanocrystalline $C_{60}$ and the lower squaraine layer (rectangles) suggests fast crystallization direction (orange arrows) either in the film plane (thus forming a spherulite), or into the plane of the film (resulting in IQE alignment). In the blended squaraine devices (f), the squaraine layer phase separates into crystalline DPASQ-rich areas (light rectangles) that interdiffuse into the $C_{60}$ and the DPSQ-rich areas (dark rectangles).

FIG. 2 plots DPASQ/C60 photovoltaic cell performance, where (a) shows current-voltage (J-V) characteristics under 1 sun, simulated AM1.5G illumination in the $4^{th}$ quadrant for as-cast (AC, solid line), SVA spherulite (dotted line), and spherulite-free IQE morphologies (dashed line) with the inset showing a single DPASQ spherulite and arrows indicating where on a substrate devices were fabricated; and (b) plots external quantum efficiency (EQE) vs. wavelength response of the devices in (a).

FIG. 3 demonstrates the interdiffusion of squaraine/$C_{60}$ junctions, where (a) is the depth profile of DPSQ/$C_{60}$/PTCBI films, and (b) is the depth profile of blended squaraine/$C_{60}$/PTCBI films before and after annealing measured using time-of-flight secondary ion mass spectrometry. The $C_2N^-$ fragment tracks the squaraine and PTCBI concentrations, and $C_9^-$ tracks the $C_{60}$ concentration. The intense $C_2N^-$ signal at the beginning of the scans arises from the PTCBI overlayer.

FIG. 4 plots EQE vs. wavelength for (a) as-cast blended devices, and (b) SVA devices. The spectral absorption ranges for $C_{60}$, DPASQ, and DPSQ are labeled.

FIG. 5 shows tandem photovoltaic cell response, where (a) plots experimental J-V characteristics in the $4^{th}$ quadrant under 1 sun, simulated AM1.5G illumination for front-only (circle), back-only (triangle), and tandem (square) organic photovoltaic cells, along with characteristics extrapolated from the model for the front sub-cell (dashed line) and back sub-cell (dotted line) for the optical fields in the tandem structure and the predicted tandem (solid line) response; and (b) plots experimental EQE spectra for front-only (circle) and back-only (triangle) organic photovoltaic cells, along with extrapolated spectra for front sub-cell (dashed line), back sub-cell (dotted line), and the sum of the two sub-cells (solid line).

FIG. 6 plots (a) current density-vs.-voltage (J-V) and (b) external quantum efficiency (EQE) characteristics for DPASQ/$C_{70}$/PTCBI junctions as-cast (AC) and after solvent vapor annealing (SVA) for 6 min.

Figure 1A:
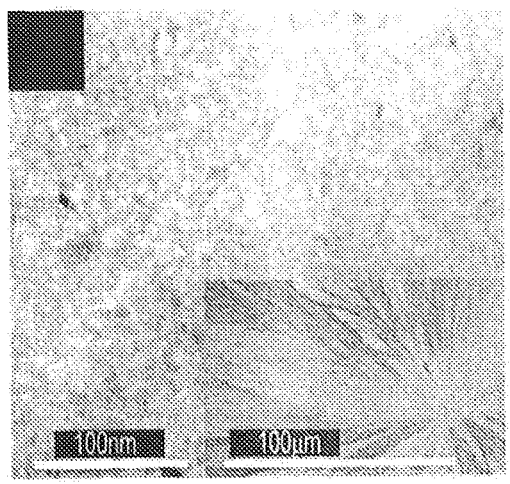

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the ambient electromagnetic radiation in relevant wavelengths to be transmitted through it. An electrode is said to be "semi-transparent" when it permits some, but less that 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, the expression that a material or component is deposited "over" another material or component means that other materials or layers may exist between the material or component being deposited and the material or component "over" which it is deposited. For example, a layer may be described as being deposited "over" an electrode, even though there are various materials or layers in between the layer and the electrode.

In the context of the organic materials of the present disclosure, the terms "donor" and "acceptor" refer to the relative positions of the HOMO and LUMO energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A layer is "amorphous" as used herein if the molecules making up the layer are primarily disordered. Thus, under the present disclosure, an amorphous layer is not precluded from having clusters of oriented molecules, so long as the layer remains primarily molecularly disordered.

As used herein, the term "crystalline" can refer to polycrystalline, nanocrystalline, or single crystal materials or films.

OPVs have maximum open-circuit voltages ($V_{OC}$) equal to the energy offset between the highest occupied molecular orbital (HOMO) of the donor and the lowest unoccupied molecular orbital (LUMO) of the acceptor, reduced by the polaron-pair binding energy. Typically, however, $V_{OC}$ is reduced from its theoretical maximum value by rapid polaron-pair formation and recombination (at respective rates, $k_{rec}$ and $k_{PPr}$) that lead to an increase in junction dark current. One means to decrease $k_{PPr}$ (and hence minimize the loss in $V_{OC}$) is to reduce intermolecular orbital overlap at the donor-acceptor (D-A) heterointerface by, for example, employing molecular species that are sterically hindered from close packing. Unfortunately, this strategy also inhibits close molecular packing of like molecules in the film bulk, resulting in OPVs with reduced exciton diffusivity and an increased internal electrical resistance. To reduce $k_{rec}$ (e.g. by reducing bimolecular recombination that governs formation of polaron pairs from free carriers, the mobility of the material must be reduced near the interface by, for example, introducing disorder into each layer, or mixing of donor and acceptor molecules at the interface. One technique to independently control interface and bulk morphologies is to solvent vapor anneal (SVA) a donor material prior to deposition of an acceptor to simultaneously minimize recombination and improve bulk charge transport in bilayer OPVs. When the donor material was annealed prior to deposition of the acceptor, however, templating of the acceptor occurred, and the $V_{OC}$ decreased due to increased $k_{rec}$ and $k_{PPr}$, as expected for an abrupt interface with close interfacial molecular packing.

In contrast, the present disclosure anneals following deposition of both the donor and acceptor layers. As disclosed herein, when one of the layers is an amorphous organic layer and the other is a crystalline organic layer, annealing can lead to inverse quasi-epitaxial (IQE) alignment of the amorphous organic layer to the crystalline organic layer, depending on the lattice matching of the materials comprising the layers. As a result, the bulk morphology and polaron-pair generation and recombination kinetics at the donor-acceptor interface of OPVs, and hence the $V_{OC}$, can be controlled.

In one embodiment of the present disclosure, a method for fabricating an organic photovoltaic device comprises depositing an amorphous organic layer and a crystalline organic layer over an electrode, wherein the amorphous organic layer and the crystalline organic layer contact one another at an interface; annealing the amorphous organic layer and the crystalline organic layer for a time sufficient to induce at least partial crystallinity in the amorphous organic layer; and depositing a second electrode over the amorphous organic layer and the crystalline organic layer.

In accordance with the methods of the present disclosure, the amorphous organic layer may be deposited over the electrode before or after the deposition of the crystalline organic layer.

All forms of annealing known in the art are contemplated by the present disclosure. In some embodiments, the annealing is chosen from solvent vapor annealing and thermal annealing. Such techniques may be performed according to methods known in the art.

In some embodiments, the amorphous organic layer and the crystalline organic layer comprise different small molecule materials.

In some embodiments, the crystalline organic layer is a nanocrystalline layer.

In some embodiments, the crystalline organic layer is a polycrystalline layer.

In some embodiments, the amorphous organic layer comprises at least one material that undergoes IQE alignment to a material of the crystalline organic layer as a result of the annealing.

As used herein, the term "inverse quasi-epitaxial (IQE) alignment" means a phenomenon in which at least one material of an amorphous layer aligns to at least one material of a crystalline layer upon post-deposition processing.

In some embodiments, IQE alignment may occur across nearly the entire area of the interface between the amorphous organic layer and the crystalline organic layer. In other embodiments, IQE alignment occurs to a lesser degree. The extent to which IQE occurs can be controlled by factors such as rates of crystallization, impurity concentrations, annealing techniques and conditions, layer thicknesses, and lattice matching.

For purposes of the present disclosure, materials for the amorphous organic layer that undergo IQE alignment to a material of the crystalline organic layer as a result of annealing are defined as materials that exhibit a lattice mismatch to a material of the crystalline organic layer in at least one crystal direction and crystal dimension of less than 15%, upon crystallization. In some embodiments, materials for the amorphous organic layer that undergo IQE alignment are chosen from materials that exhibit a lattice mismatch to a material of the crystalline organic layer in at least one crystal direction and crystal dimension of less than 10%, less than 8%, less than 5%, less than 4%, less than 3%, less than 2%, less than 1%, less than 0.5%, less than 0.3%, or less than 0.1%, upon crystallization. Lattice matching in one crystalline direction may be further described as "point-on-line epitaxy." In some embodiments, the at least one crystal dimension is interplanar spacing. In some embodiments, the at least one crystal dimension is defined by at least one lattice constant. In some embodiments, the requisite lattice matching may be achieved based on lattice mismatch to rational multiples of the at least one crystal dimension. For example, for purposes of determining lattice mismatch to the material of the crystalline organic layer, the lattice constants for calculating lattice mismatch or interplanar spacing mismatch may be considered in rational multiples (e.g. multipliers of 1, 1.5, 2, or 3). This concept can also follow complex relationships including rotations of crystal structures relative to each other.

In some embodiments, materials for the amorphous organic layer that undergo IQE alignment are chosen from materials that exhibit a lattice mismatch to a material of the crystalline organic layer in at least two crystal directions and crystal dimensions of less than 15%, less than 10%, less than 8%, less than 5%, less than 4%, less than 3%, less than 2%, less than 1%, less than 0.5%, less than 0.3%, or less than 0.1%, upon crystallization.

Those of ordinary skill in the art should understand that materials for the organic amorphous layer and the crystalline organic layer may be chosen based on literature data for the crystalline structures of such materials and applying the guidelines herein. Alternatively, to the extent that data on the crystalline structure of certain materials is not disclosed in the literature, crystalline structures may be measured according to techniques known in the art.

The at least one material that undergoes IQE alignment may be a donor or an acceptor relative to the material of the crystalline organic layer. In certain embodiments, the at least one material that undergoes IQE alignment comprises a squaraine or derivative thereof. In some embodiments, the at least one material that undergoes IQE alignment is a donor relative to the material of the crystalline organic layer, and the material of the crystalline organic layer comprises a fullerene or derivative thereof.

The IQE alignment as described herein occurs simultaneously with interdiffusion between the material undergoing IQE alignment and the material to which it is aligned. It is proposed that crystalline mismatch plays a significant role in solid-solubility, such as the organic molecular analogue to the Hume-Rothery model where well-matched lattice dimensions and crystal structures have an improved solid solubility. Thus, as lattice matching increases, solid solubility improves, resulting in interdiffusion between the material undergoing IQE alignment and the material to which it is aligned. The interdiffusion at the interface between the once amorphous organic layer and the crystalline organic layer forms a bulk or mixed heterojunction between donor and acceptor materials, improving short circuit current in a photovoltaic device.

A registered interface between the once amorphous organic layer and the crystalline organic layer through IQE alignment can lead to enhanced polaron pair formation (via a Langevin like process) and subsequent recombination, and hence a reduced $V_{OC}$. Thus, it can be advantageous to control the extent to which this crystallization occurs. In some embodiments, the amorphous organic layer further comprises at least one material (i.e., an impurity) that does not undergo IQE alignment to the material of the crystalline organic layer as a result of the annealing. Such a material may lead to phase separation in the amorphous organic layer as a result of the annealing and may form an energetic barrier to IQE alignment. For example, FIG. 1(f) shows the phase separation between DPASQ (light rectangles), which is the material that undergoes IQE alignment, and DPSQ (dark rectangles), which is the material that does not undergo IQE alignment.

For purposes of the present disclosure, materials that do not undergo IQE alignment are defined as materials that exhibit a lattice mismatch to the material of the crystalline organic layer in all crystal directions and crystal dimensions of greater than 15%, upon crystallization, or as materials that exhibit minimal crystallization under the annealing conditions used and therefore cannot align with the material of the crystalline organic layer. In some embodiments, materials that do not undergo IQE alignment are chosen from materials that exhibit a lattice mismatch to the material of the crystalline organic layer in all crystal directions and crystal dimensions of greater than 20%, greater than 25%, or greater than 30%, upon crystallization. Thus, those of ordinary skill in the art should understand that materials for the organic amorphous layer and the crystalline organic layer may be chosen using literature data for the crystalline structures of such materials and applying the guidelines herein. Alternatively, to the extent that data on the crystalline structure of certain materials is not disclosed in the literature, crystalline structures may be measured according to techniques known in the art.

The at least one material that undergoes IQE alignment and the at least one material that does not undergo IQE alignment may both be donors or both be acceptors relative to the material of the crystalline organic layer. In certain embodiments, the materials that do and do not undergo IQE alignment are chosen from squaraines and derivatives thereof. These materials may also be chosen to have complementary absorption spectra, i.e., the wavelengths at which each material exhibits high absorptivity do not substantially overlap. In certain embodiments, the material of the crystalline organic layer comprises a fullerene or derivative thereof.

The amount of each material undergoing and not undergoing IQE alignment to the material of the crystalline organic layer can be optimized to achieve maximum photovoltaic device performance. The proper ratio of these materials will vary depending on the types of materials used in the amorphous organic layer and the crystalline organic layer. For example, it may be appropriate to combine a larger amount of impurity (i.e., the material that does not undergo IQE alignment) with a material that exhibits a near perfect lattice match with the organic crystalline material, and hence shows aggressive IQE alignment, to at least partially inhibit such aggressive IQE crystallization and increase $V_{OC}$. The proper ratio may also depend on the degree to which the materials phase separate. For example, if the material undergoing IQE alignment mixes well with the impurity, then less impurity may be needed to control IQE crystallization. On the other hand, if the material undergoing IQE alignment mixes poorly, and thus separates easily, with the impurity, then more impurity may be needed to control IQE crystallization.

In some embodiments, the method of the present disclosure further comprises depositing at least one buffer layer over the amorphous organic layer and the crystalline organic layer before annealing. In these embodiments, the buffer layer is also exposed to annealing. Suitable buffer layers may be chosen from those known in the art for photovoltaic devices. For example, the at least one buffer layer may be an electron or hole transport layer or an exciton-blocking electron or hole transport layer.

Layers and materials may be deposited using techniques known in the art. For example, the layers and materials described herein can be deposited from a solution, vapor, or a combination of both. In some embodiments, organic materials or organic layers can be deposited or co-deposited via solution processing, such as by one or more techniques chosen from spin-coating, spin-casting, spray coating, dip coating, doctor-blading, inkjet printing, or transfer printing.

In other embodiments, organic materials may be deposited or co-deposited using vacuum evaporation, such as vacuum thermal evaporation, organic vapor phase deposition, or organic vapor-jet printing.

In some embodiments, layers may be deposited on separate substrates according to known methods, and, subsequently, one or more of the layers may be transferred and combined with one or more other layers to form a device.

The methods of the present disclosure may have particular advantages when the amorphous organic layer and the crystalline organic layer are deposited using different deposition techniques, such that intermixing of the layers to form a bulk or mixed donor-acceptor heterojunction is not possible upon deposition. The IQE alignment phenomenon of the present disclosure allows the layers to be intermixed, forming a bulk or mixed donor-acceptor heterojunction, post-deposition. In this way, short circuit current may be increased. Thus, in some embodiments, the amorphous organic layer and the crystalline organic layer are deposited using different deposition techniques. In certain embodiments, the amorphous organic layer is deposited using a solution processing technique and the crystalline organic layer is deposited using a vacuum deposition technique.

One of the electrodes of the present disclosure may be an anode, and the other electrode a cathode. It should be understood that the electrodes should be optimized to receive and transport the desired carrier (holes or electrons). The term "cathode" is used herein such that in a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner.

Additional layers known in the art for photovoltaic devices may be deposited in accordance with the disclosed methods. For example, buffer layers, such as smoothing layers and/or appropriate exciton-blocking hole or electron transport layers may be deposited between an electrode and one of the amorphous organic layer and crystalline organic layer.

Tandem organic photovoltaics comprising two or more subcells may also be fabricated according to the methods of the present disclosure. A subcell, as used herein, means a component of the device which comprises at least one photoactive region having a donor-acceptor heterojunction. When a subcell is used individually as a photosensitive optoelectronic device, it typically includes a complete set of electrodes. A tandem device may comprise charge transfer material, electrodes, or charge recombination material or a tunnel junction between the tandem donor-acceptor heterojunctions. In some tandem configurations, it is possible for adjacent subcells to utilize common, i.e., shared, electrode, charge transfer region or charge recombination zone. In other cases, adjacent subcells do not share common electrodes or charge transfer regions. The subcells may be electrically connected in parallel or in series.

In some embodiments of the disclosed methods, the amorphous organic layer and the crystalline organic layer comprise a first photoactive region, and the method further comprises depositing a charge recombination or charge transfer layer over the first photoactive region, and depositing a second photoactive region over the charge recombination or charge transfer layer between the first and second electrodes.

In some embodiments, the charge transfer layer or charge recombination layer may be chosen from Al, Ag, Au, $MoO_3$, Li, LiF, Sn, Ti, $WO_3$, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

Also disclosed herein is a method of intermixing materials at an interface, comprising: providing a film comprising an organic layer and a crystalline organic layer disposed over a substrate, wherein the organic layer contacts the crystalline organic layer at the interface; and annealing the organic layer and the crystalline organic layer.

The organic layer may be amorphous or crystalline. In some embodiments, the organic layer is amorphous and comprises at least one material that undergoes inverse-quasi epitaxial (IQE) alignment to a material of the crystalline organic layer as a result of the annealing. The amorphous organic layer may further comprise at least one material that does not undergo IQE alignment to the material of the crystalline organic layer as a result of the annealing. Materials for the amorphous organic layer and crystalline organic layer may be chosen as described herein.

In some embodiments, the annealing is chosen from solvent vapor annealing and thermal annealing.

The at least one material that undergoes IQE alignment may be a donor or an acceptor relative to the material of the crystalline organic layer. In some embodiments, the at least one material that undergoes IQE alignment and the at least one material that does not undergo IQE alignment are donors relative to the material of the crystalline organic layer. In some embodiments, the at least one material that undergoes IQE alignment and the at least one material that does not undergo IQE alignment are acceptors relative to the material of the crystalline organic layer. In certain embodiments, the material of the crystalline organic layer comprises a fullerene or a derivative thereof.

The step of providing a film comprising an organic layer and a crystalline organic layer disposed over a substrate may comprise depositing an organic layer and a crystalline organic layer over the substrate, wherein the organic layer and the crystalline organic layer are deposited using different techniques. In certain embodiments, the organic layer is deposited using a solution processing technique and the crystalline organic layer is deposited using a vacuum deposition technique.

The film may further comprise a buffer layer, as described herein, disposed over the organic layer and the crystalline organic layer such that the buffer layer is also exposed to the annealing.

Also disclosed herein is an organic photovoltaic device comprising two electrodes in superposed relation; and a photoactive region positioned between the two electrodes, wherein the photoactive region comprises a donor layer and an acceptor layer forming a donor-acceptor heterojunction, wherein one of the donor layer and the acceptor layer is a crystalline layer and the other of the donor layer and the acceptor layer comprises at least one material that has undergone IQE alignment to a material of the crystalline layer.

As used herein, the term "photoactive region" refers to a region of the device that contains at least one donor-acceptor heterojunction. The photoactive region absorbs electromagnetic radiation to generate excitons. The excitons may dissociate into an electron and a hole in order to generate an electrical current.

In some embodiments, the donor layer and the acceptor layer are annealed. In some embodiments, the annealing is chosen from solvent vapor annealing and thermal annealing.

In some embodiments, the layer that comprises the at least one material that has undergone IQE alignment further comprises at least one material that has not undergone IQE alignment to the material of the crystalline layer.

In certain embodiments, the at least one material that has undergone IQE alignment comprises a squaraine or derivative thereof.

In certain embodiments, the material of the crystalline layer is a fullerene or derivative thereof.

The device may include additional layers as known in the art for photovoltaic devices, such buffer layers.

The present disclosure contemplates tandem devices. Thus, the device may further comprise a second photoactive region positioned between the two electrodes, wherein a charge recombination or charge transfer layer is positioned between the photoactive region. The tandem devices may also include additional layers as known in the art for photovoltaic devices. For example, the charge recombination or charge transfer layer between the photoactive regions may be positioned adjacent one or more buffer layers.

It should be understood that embodiments described herein may be used in connection with a wide variety of structures. Functional organic photovoltaic devices may be achieved by combining the various layers described in different ways, or layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLES

Example 1: SVA of Squaraine Films

"Solvent vapor annealing" (SVA) of blends of two archetype functionalized squaraines, (a) the symmetric, 2,4-bis[4-(N,N-diphenylamino)-2,6-dihydroxyphenyl]squaraine (DPSQ), and (b) the asymmetric [2-[4-(N,N-diphenylamino)-2,6-dihydroxyphenyl]-4-[4-diphenyliminio] squaraine] (DPASQ), led to their phase separation, alignment to, and ultimately interdiffusion with a nanocrystalline fullerene ($C_{60}$) cap.

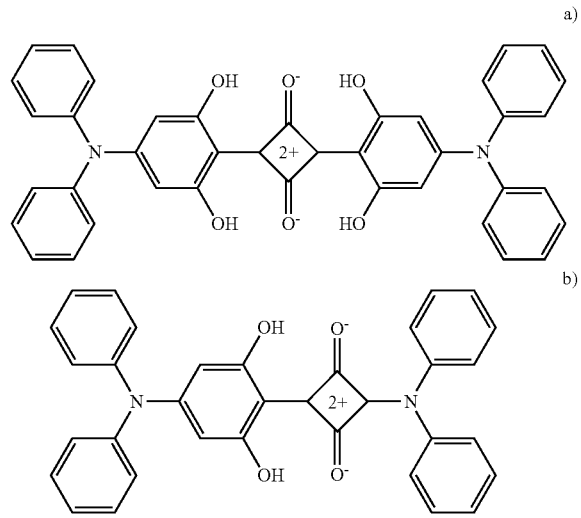

DPASQ and DPSQ were chosen, in part, because they exhibit strong absorption in the green and near infrared (NIR) spectral regions, respectively, open circuit voltages approaching $V_{OC}=1$ V, and efficient energy transport that results in high performance photovoltaic cells. It was previously shown that when DPSQ films were annealed by exposure to dichloromethane vapor for ~9 min, they crystallized into nanometer-scale domains. This roughened the film surface without developing pinholes or voids. In contrast, DPASQ aggressively crystallized with <4 min exposure to the vapor, resulting in the formation of spherulites (FIG. 1(a) inset). The presence of spherulites indicates a strong driving force for crystallization of the amorphous DPASQ, with highly asymmetric crystal growth rates. The spherulites grew from their nucleation site with the fast-crystallization direction oriented radially in the film plane. Growth occurred until the crystallite encountered an energetically relaxed region (e.g. another spherulite), and typically proceeded until the entire film was crystallized.

To inhibit spherulite formation and the attendant film roughening, SVA was performed following the deposition of a 40 nm-thick $C_{60}$ acceptor and a 5 nm-thick 3,4,9,10-perylenetetracarboxylic bisbenzimidazole (PTCBI) buffer layer. The reduced density of spherulite nucleation sites resulted from additional confinement imparted by eliminating the free surface. Spherulitic crystallization, however, was not completely absent, and the spherulites that nucleate grew to a terminal diameter of 0.5-1.5 mm (FIG. 1(a), inset). Atomic force microscope images showed that the surfaces of the PTCBI above both the spherulite and in the spherulite-free regions underwent only minor increases in roughness on SVA (i.e. the root-mean-square roughness increases from rrms≈1.1±0.1 for the as-cast film to 1.6±0.1 nm for the SVA films).

Figure 1B:
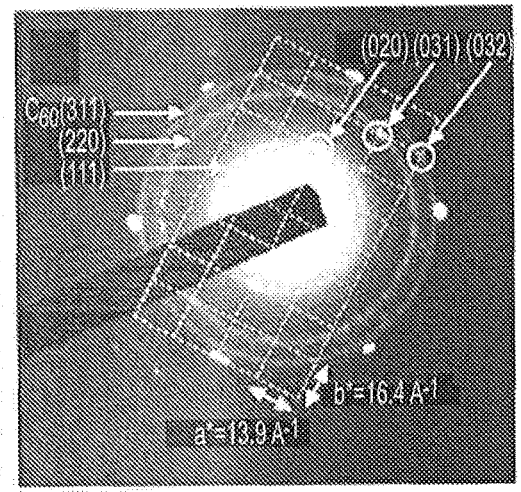

Transmission electron microscope (TEM) images and selected area electron diffraction (SAED) patterns of a spherulite in a SVA DPASQ/$C_{60}$/PTCBI layer stack are shown in FIGS. 1(a) and 1(b), respectively. The plan-view TEM showed a relatively featureless field, and the SAED pattern showed three uniform rings originating from the (111), (220), and (311) diffraction orders of the as-deposited, polycrystalline $C_{60}$, along with a rectangular array of spots corresponding to diffraction from a single crystal of DPASQ within a spherulite. The DPASQ had surface unit mesh spacings of a=6.95±0.04 Å and b=8.21±0.04 Å offset by 90°. These lattice constants match those measured for a monoclinic single crystal for the c-direction (13.99 Å), but indicate an extension of ~2% in the b-direction.

A family of diffraction orders from the single-crystal DPASQ lays on each of the three $C_{60}$ diffraction rings (intersections circled in FIG. 1(b)). Note that the (20) spot has <0.5% mismatch with the $C_{60}$ (111) ring, and near-perfect matching between the (31) and (32) diffraction orders of DPASQ and the (220) and (311) diffraction rings of $C_{60}$, respectively. Although not visible in FIG. 1(b), the (100) lattice constant of $C_{60}$ (14.15 Å) has ~1% lattice mismatch with the (010) lattice constant of DPASQ. This abundance of lattice coincidences resulted in several possible quasi-epitaxy registrations between the DPASQ and $C_{60}$. This epitaxial relationship was well-defined within the surface plane in one direction (e.g., <020> DPASQ is parallel to <111> $C_{60}$), but perpendicular relationships were not obvious, suggesting a point-online lattice registration. It was not possible, however, to unambiguously identify all preferred alignments between the two crystal lattices since the interface was buried, and hence was inaccessible to surface probes commonly used to identify specific registrations.

Figure 1C:
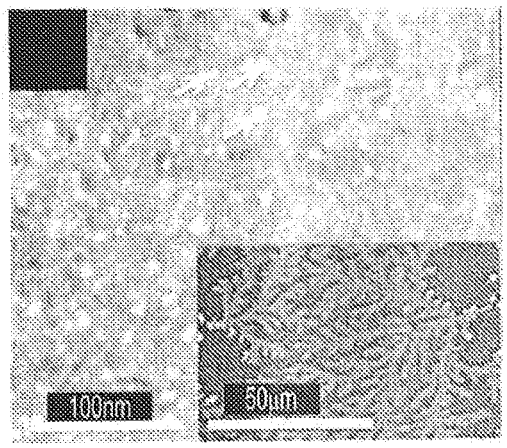
Figure 1D:
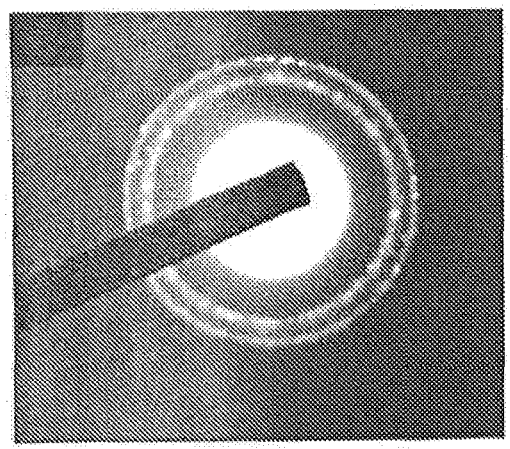
Figure 1F:
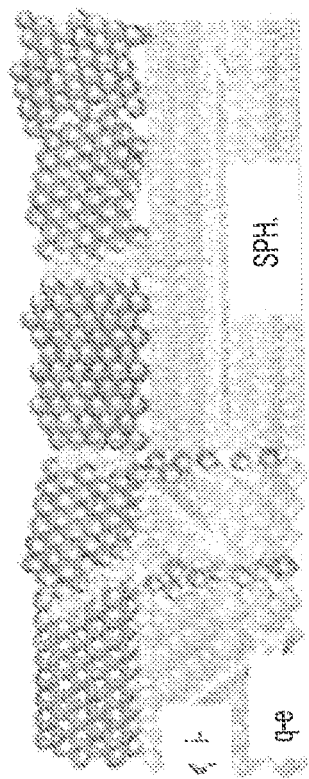

The plan-view TEM image in FIG. 1(c) of a similar, but spherulite-free DPASQ:DPSQ blended squaraine layer with a volume ratio of 4:6 that was annealed following the deposition of $C_{60}$ and PTCBI, showed distinct mottling (arrows), suggesting phase separation. Phase separation was also observed after SVA of the bare, blended squaraine films, but on a much larger length scale than in the capped film (see FIG. 1(c), inset). The SAED pattern in FIG. 1(d) showed only larger Bragg diffraction spots from crystallized DPASQ decorating the $C_{60}$ diffraction rings but not for {023} or {040}, the families of planes with the strongest reflections. From this it was inferred that the fast crystallite growth is redirected into the film by the $C_{60}$ cap, as opposed to parallel to the film in the case of spherulite growth where there was only coincidental quasi-epitaxy (q-e) alignment between the blends and the $C_{60}$. The lack of diffraction from {023} and {040} indicated that the underlying film was not randomly polycrystalline, but only contained grains oriented at specific directions along grains of $C_{60}$. There was no evidence of IQE alignment of DPSQ, suggesting that only nanocrystalline or amorphous DPSQ phases existed in the blend.

Figure 1E:
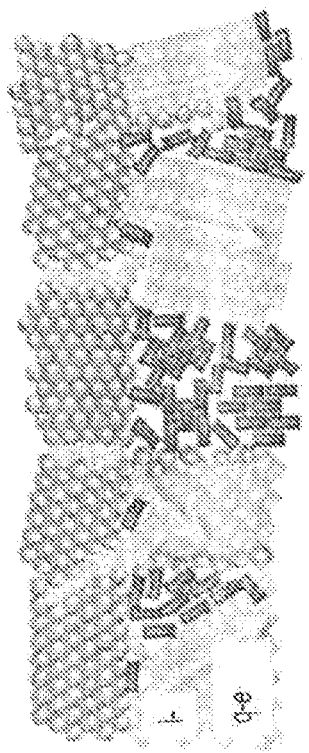

The IQE growth of crystalline domains of DPASQ (molecules indicated by light rectangles) relative to the $C_{60}$ cap template (circles) is illustrated in FIG. 1(e). FIG. 1(f) shows phase separation of the squaraine blend followed by IQE growth initiated from the interface with $C_{60}$ that subsequently propagates through the bulk of the DPASQ. The DPSQ (dark rectangles) layer had, at best, nanoscale crystallinity. Both illustrations suggest interdiffusion of DPASQ and $C_{60}$.

Figure 3A:
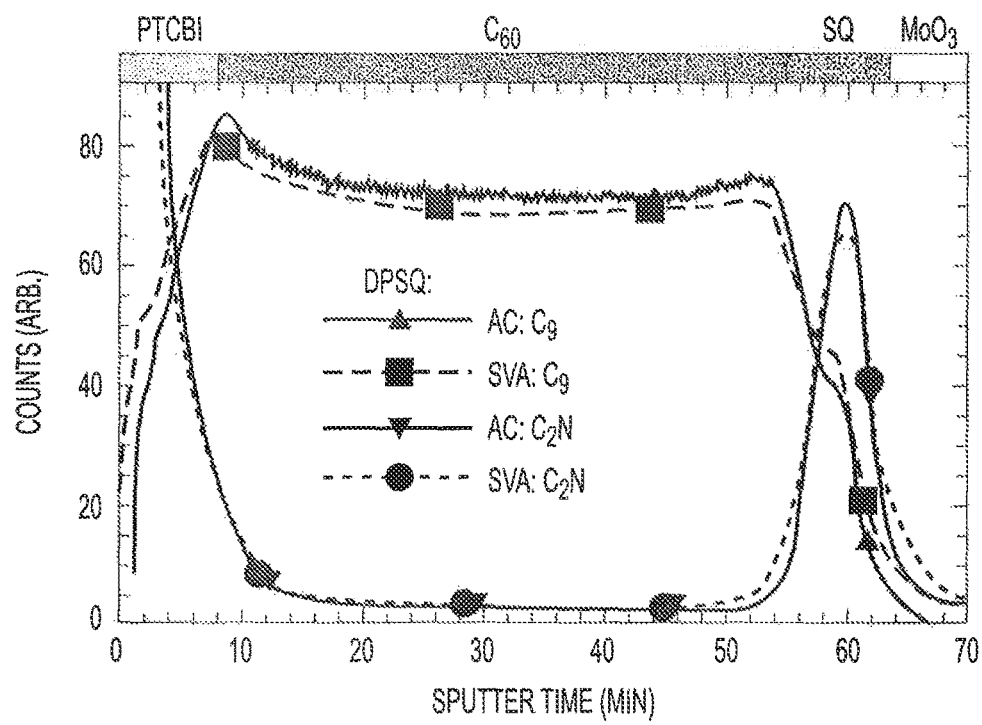
Figure 3B:
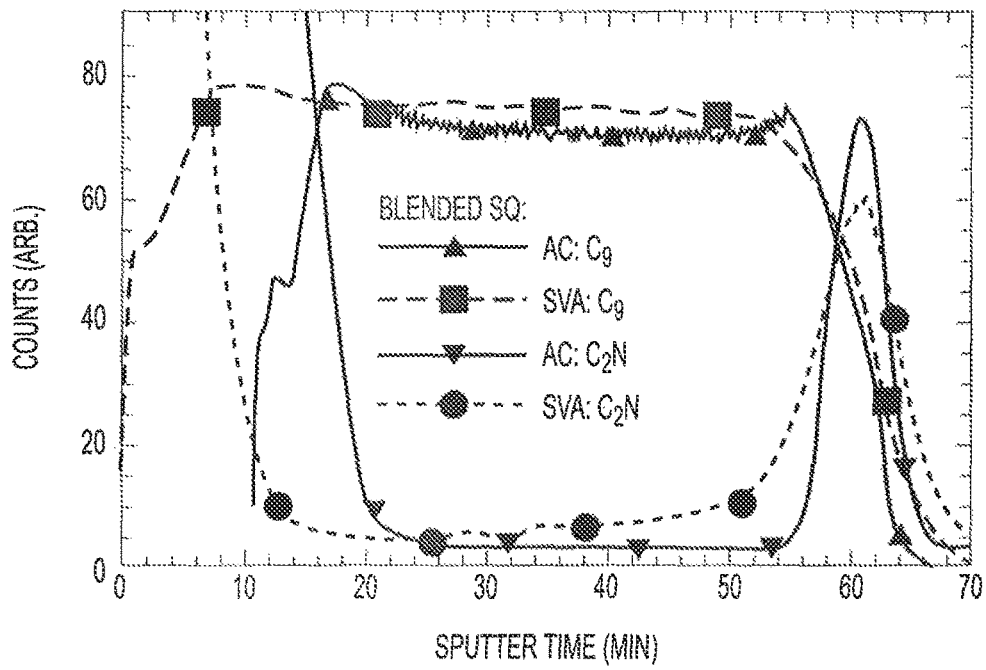

Time-of-flight secondary ion mass spectrometry (TOF-SIMS) was used to quantify the intermixing of materials in spherulite-free layer stacks of a 4:6 blend of DPASQ:DPSQ/$C_{60}$/PTCBI and DPSQ/$C_{60}$/PTCBI (FIG. 3). Gaussian-shaped distributions of squaraine (tracked by the $C_2N^-$ signal) were found for both the as-cast (AC) blended squaraine and neat DPSQ layers, whereas the $C_{60}$ distribution (tracked by the $C_9^-$ signal; also produced by the squaraines and PTCBI, albeit at a lower yield) was constant throughout the $C_{60}$ layer. The AC blended DPSQ/$C_{60}$ and DPSQ:DPASQ/$C_{60}$ structures had abrupt interfaces within the experimental resolution limits. Hence, in this case, intermixing was not observed. The slight broadening observed for the DPSQ peak on SVA was predominately a function of the increased roughness at the surface of the stack, but may indicate minor roughening or interdiffusion at the DPSQ/$C_{60}$ interface, which could account for the ~30% increase in photocurrent on SVA. In contrast, after a 7 min SVA, the blended squaraine/$C_{60}$ structure exhibited a long squaraine tail that penetrated through >30 nm of the $C_{60}$ layer with an average concentration of 4±2 vol %. The $C_{60}$ signal was observed throughout the entire squaraine layer, comprising 18±6 vol % of the mixture, creating two bulk heterojunction-like layers that resulted in the ~60% increase in EQE compared to the as-cast devices.

The increase in $J_{SC}$ and EQE on SVA of blended DPASQ and DPSQ junctions resulted from phase separation at a length scale of nanometers, as evidenced by the TEM images (FIG. 1), and interdiffusion of the DPASQ and $C_{60}$ (FIG. 3). This intermixing drew $C_{60}$ into the DPASQ to create fingers of acceptor regions in contact with DPSQ throughout the layer, thereby increasing the internal quantum efficiency (IQE). Since optical wavelengths are much larger than the crystallite dimension or spacing, the incident optical field fully encompassed multiple DPSQ, DPASQ, and $C_{60}$ fingers. The resulting bulk heterojunction prevented the reduction in IQE, as anticipated for a homogeneous donor-layer blend where the absorption of by one species in the blend is reduced in proportion to its volume fraction.

Example 2: Performance of Photovoltaic Devices Using DPASQ

Figure 2A:
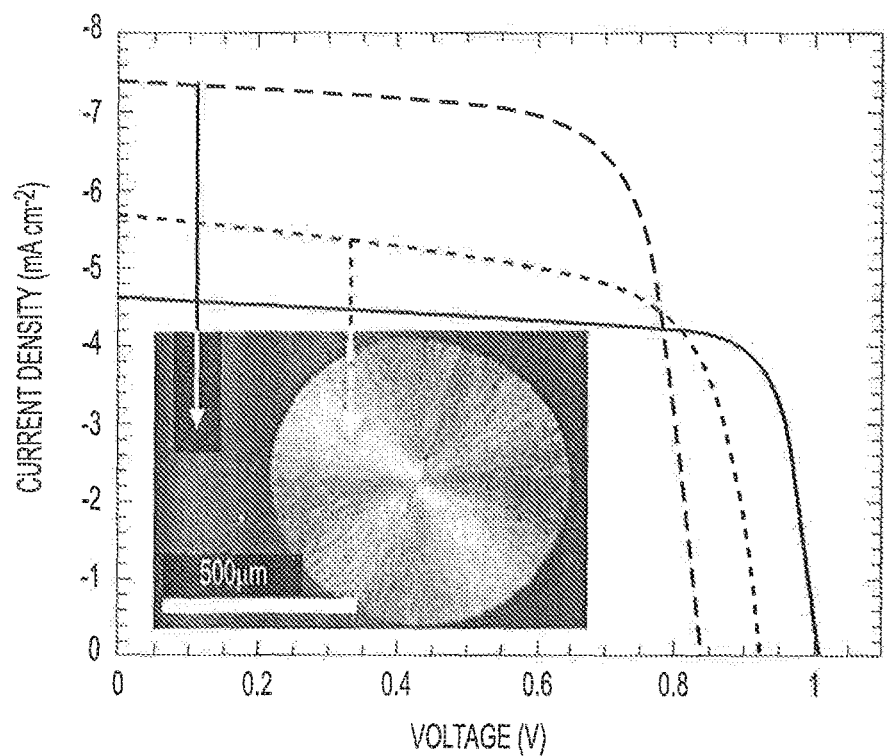
Figure 2B:
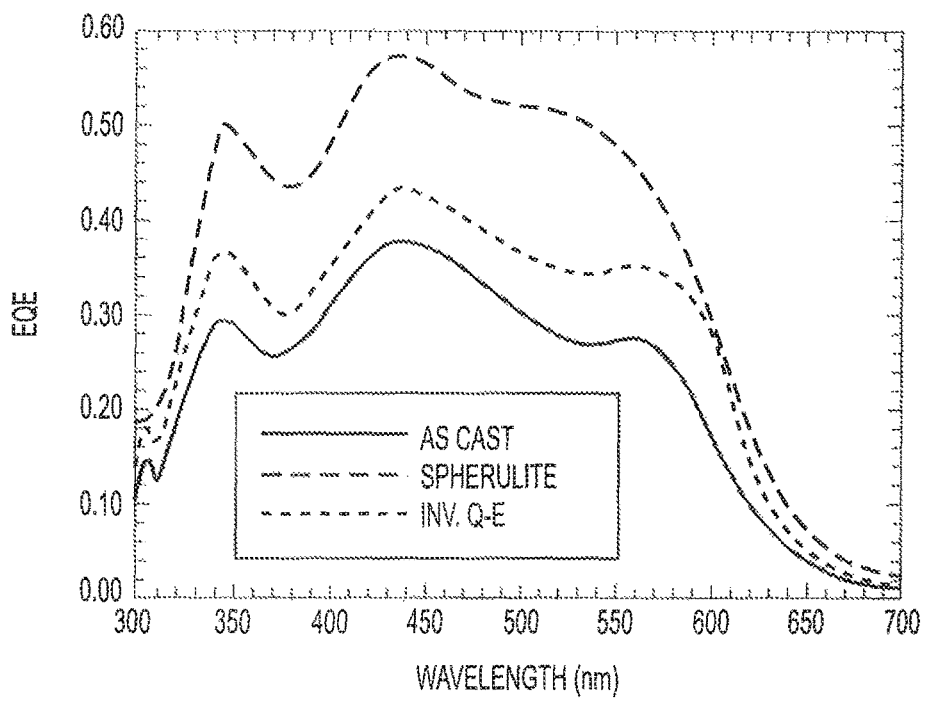

Current density-voltage (J-V) characteristics for devices with the structure: glass substrate/100 nm indium tin oxide (ITO)/15 nm $MoO_3$/16 nm DPASQ/40 nm $C_{60}$/5 nm PTCBI/100 nm Ag are shown for three different film morphologies in FIG. 2(a). As-cast DPASQ/$C_{60}$ devices had $V_{OC}$=0.99±0.01 V, short circuit current density of $J_{SC}$=4.6±0.2 mA/cm$^2$, and fill factor of FF=74±1%, resulting in a power conversion efficiency under simulated 1 sun, AM 1.5G illumination of $\eta_P$=3.4±0.2%. After SVA, two regions were observed: spherulitic and inverse q-e growth areas. The latter regions were uniform in appearance in contrast to those exhibiting spherulitic growth. Devices fabricated on the inverse q-e areas had $V_{OC}$=0.83±0.01 V, $J_{SC}$=7.4±0.4 mA/cm$^2$, and FF=72±1%, with an efficiency of $\eta_P$=4.4±0.2%. The significant drop in $V_{OC}$ that resulted from the inverse q-e process was indicative of increased orbital overlap between the donor molecular HOMO and acceptor LUMO, and thus increased Langevin-mediated polaron-pair formation resulting from crystalline, high-mobility material extending to the D-A interface (leading to increased $k_{PPr}$). Devices fabricated directly on spherulites were generally electrically shorted; however, in those cases when the devices showed diode characteristics, their external quantum efficiency (EQE), $J_{SC}$, and $V_{OC}$ were between that of the as-cast and inverse q-e areas, and had slightly lower fill factors with a corresponding efficiency of $\eta_P$=3.5±0.2%. This intermediate $V_{OC}$ resulted from the increased $k_{rec}$ associated with the improved crystallinity of DPASQ, but poor intermolecular coupling between the DPASQ and $C_{60}$ crystallites caused by the lack of epitaxial alignment. FIG. 2(b) shows the EQE vs. wavelength ($\lambda$) characteristic for the same devices, comparing as-cast, and SVA samples both on spherulites and spherulite-free areas. The EQE increased nearly uniformly across the spectrum in both SVA samples, consistent with the observed changes in $J_{SC}$.

Example 3: Replacing the $C_{60}$ Cap Layer with a $C_{70}$ Cap Layer

Figure 6A:
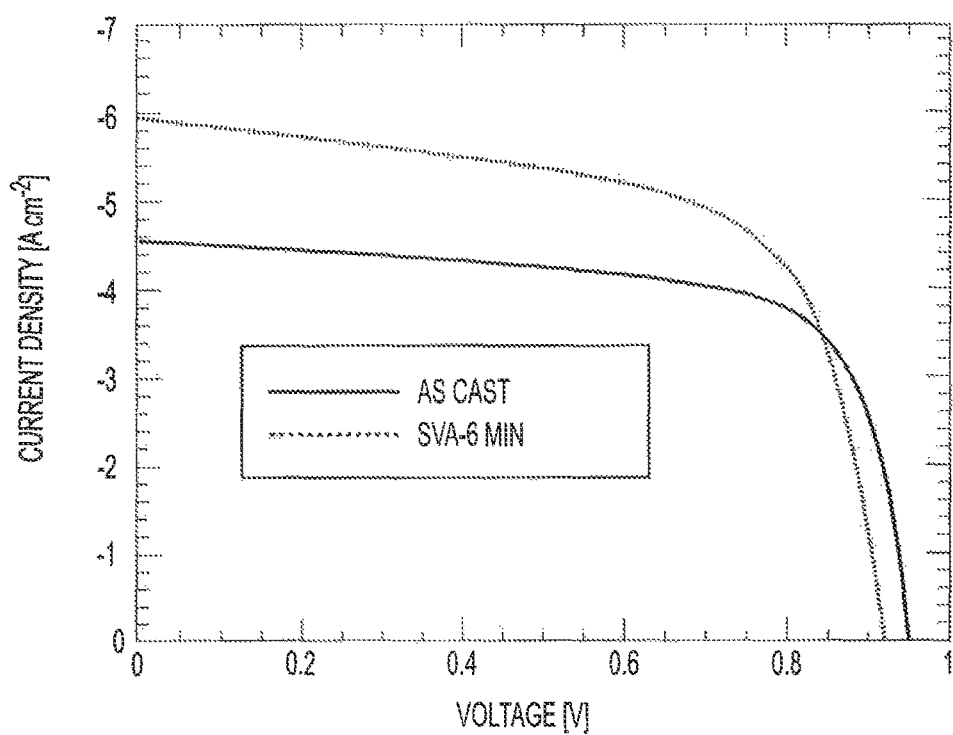
Figure 6B:
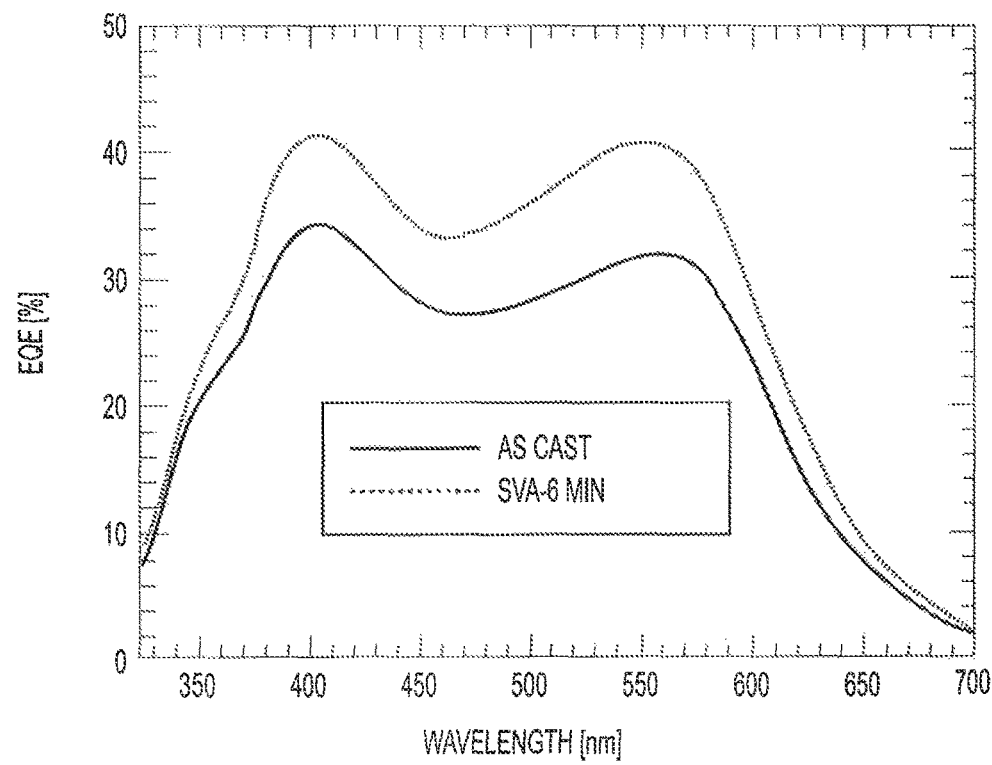

Replacing the spherical $C_{60}$ with the rugby-ball-shaped $C_{70}$ led to a reduced tendency for spherulite formation on SVA. In these latter devices, spherulite formation was observed only after >7 min of SVA; the maximum OPV efficiency was achieved after 6 min, approximately double the time needed for analogous $C_{60}$-based junctions. The J-V response and EQE for as-cast and SVA DPASQ/$C_{70}$ junctions are shown in FIG. 6. For as-cast devices, a short circuit current density of $J_{SC}$=4.5±0.2 mA/cm$^2$, an open circuit voltage of $V_{OC}$=0.96±0.01 V, a fill factor of FF=59±1% and a power conversion efficiency of $\eta_P$=2.6±0.1% were observed. After 6 min exposure to dichloromethane, $J_{SC}$=5.9±0.3 mA/cm$^2$, $V_{OC}$=0.92±0.01 V, FF=64±1% and $\eta_P$=3.5±0.2% were obtained. The percentage increase in $J_{SC}$ is comparable to devices employing DPSQ:$C_{60}$ junctions that were shown to undergo significantly less interdiffusion on SVA than DPASQ/$C_{60}$ (FIG. 3), suggesting only limited interdiffusion with $C_{70}$. SAED measurements of a DPASQ/$C_{70}$ structure annealed for 6 min showed no evidence of crystallization. Similar to the case of DPASQ/$C_{60}$, $J_{SC}$ for the DPASQ/$C_{70}$ device was increased following SVA; however, the accompanying drop in $V_{OC}$ was only ~0.04 V, or ~25% that in the $C_{60}$-based devices. This was consistent with the DPSQ/$C_{60}$ system that lacked IQE alignment on SVA following deposition of $C_{60}$, and hence exhibited no decrease in $V_{OC}$.

In the case of $C_{70}$, interfacial molecular orbital overlap was limited by lack of self-organization of the fullerene, and hence, it did not serve as a template for the underlying squaraine molecules. The markedly reduced interactions of the DPASQ/$C_{70}$ and DPSQ/$C_{60}$ junctions, and the observed differences between the extent of interdiffusion of donors and acceptors for junctions with different crystalline registrations, demonstrated that lattice constant and crystalline mismatch played a significant role in solubility. This is the organic molecular analogue to the Hume-Rothery model where well-matched lattice dimensions and crystal structures have an improved solid solubility.

Example 4: Blended Devices

Organic photovoltaic (OPV) devices were fabricated on glass substrates pre-coated with a 100 nm thick layer of indium tin oxide (ITO) previously cleaned by sonicating in detergent and a series of solvents including heated trichloroethylene, acetone, and heated isopropanol. Substrates were then snow-cleaned to remove particulates and subsequently exposed to UV/ozone for 10 min before loading into a vacuum chamber (base pressure<1×10$^{-7}$ Torr) where $MoO_3$ (15 nm) was thermally deposited at a rate of 0.1 nm/s. Substrates were directly transferred into a high-purity nitrogen-filled glovebox (<10 ppm $O_2$ and $H_2O$), where squaraines were cast from solutions of ~1.8 mg/ml of squaraine in chloroform. The squaraines were synthesized, purified, and filtered as described previously. A spin-coating ramp rate of 1000 rpm/s with a final speed of 3000 rpm produced ~16 nm-thick films. The 40 nm-thick $C_{60}$ (MER Corp., sublimed grade with one additional purification via gradient sublimation purification) and the 8 nm-thick 3,4,9,10-perylenetetracarboxylic bisbenzimidazole (PTCBI, Sensient Technologies Corp. sublimed grade) layer were deposited via vacuum thermal evaporation at a rate of 0.1 nm/s. Finally, 100 nm-thick Ag cathodes were deposited through a shadow mask with 1 mm-diameter apertures at a rate of 0.1 nm/s. All organic layer thicknesses were calibrated using variable-angle spectroscopic ellipsometry in their transparent spectral regions.

Solvent vapor annealing was performed after deposition of the PTCBI buffer in 500 ml vials containing an excess of dichloromethane. SVA times of 4 min and 9 min were optimal for neat DPASQ and DPSQ layers, respectively, while the optimal for blends was intermediate between that of the neat layers. A 7.5 min SVA was performed on the blended squaraine/$C_{70}$ cell after PTCBI deposition in the tandem device.

Figure 4A:
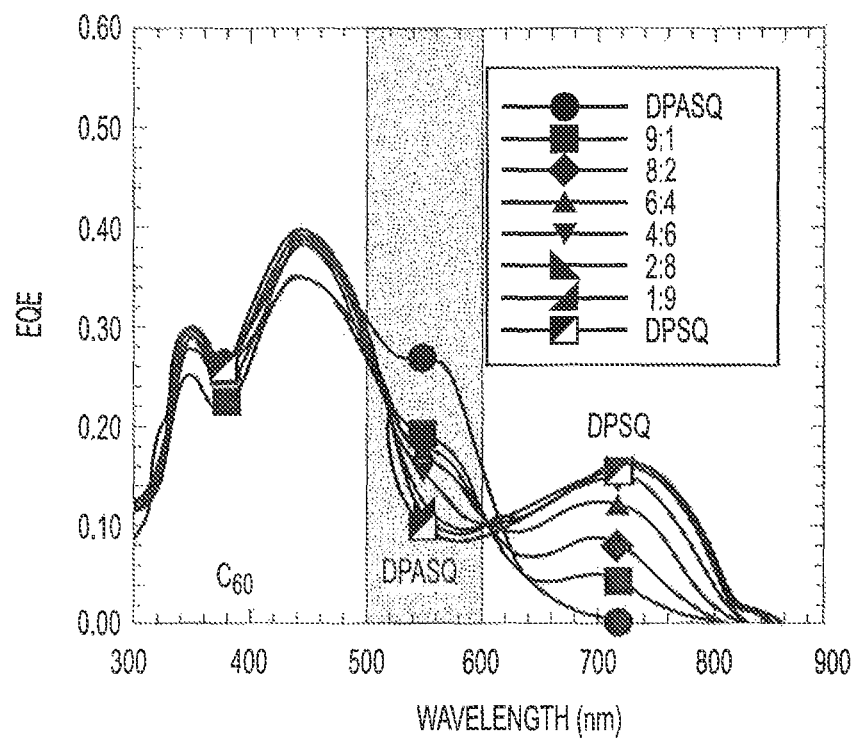

Spherulite formation can be inhibited by incorporating impurities that form an energetic barrier to crystallization. DPSQ was introduced as an impurity that simultaneously extended the absorption of the blend into the NIR. Spherulite formation was frustrated for 10 vol % DPSQ in DPASQ, and was completely arrested at 20 vol % DPSQ. FIG. 4(a) is a plot of EQE vs. wavelength, $\lambda$, for OPVs made from various as-cast blends of DPASQ and DPSQ. The EQE contributed from absorption in the $C_{60}$ (i.e. $\lambda$<500 nm) was independent of blend ratio. On addition of 10 vol. % DPSQ, response from DPSQ at $\lambda$>650 nm appeared and the EQE arising from absorption in the DPASQ ($\lambda\approx$550 nm) decreased by ~50% due to trapping of excitons on the lower energy gap DPSQ, thereby reducing exciton diffusivity. Further increases in DPSQ concentration led to a monotonic increase in NIR response and a decrease in DPASQ response.

Figure 4B:
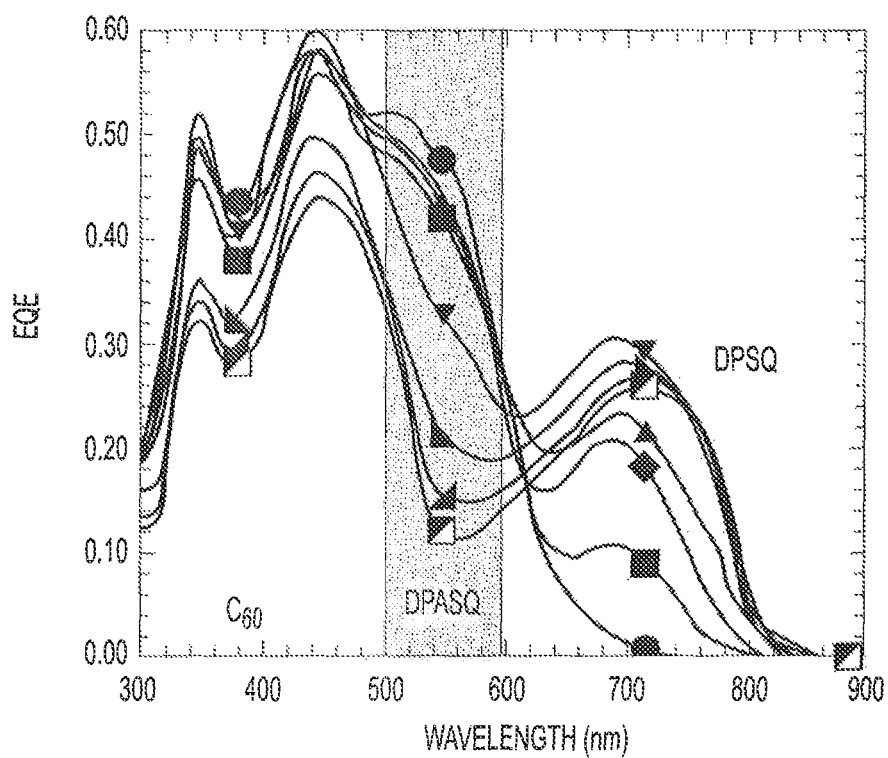

Following SVA, all blended devices showed significantly increased photosensitivity, with the response at $\lambda\approx$550 nm roughly proportional to the DPASQ concentration, indicative of the absence of exciton trapping (FIG. 4(b)). All devices with <60 vol. % DPSQ showed a similar EQE$\approx$58% at $\lambda$=440 nm resulting from $C_{60}$ absorption, while those with a higher DPSQ concentration had a response approaching that of a DPSQ/C$_{60}$ heterojunction. The EQE arising from DPSQ absorption at λ≈750 nm increased with concentration, reaching a peak EQE=30% for 60 vol. % DPSQ (i.e. 4:6 blend of DPASQ:DPSQ). Further increases in DPSQ concentration led to a concomitant reduction in response, similar to that of the neat DPSQ/C$_{60}$ junction.

Figure 7A:
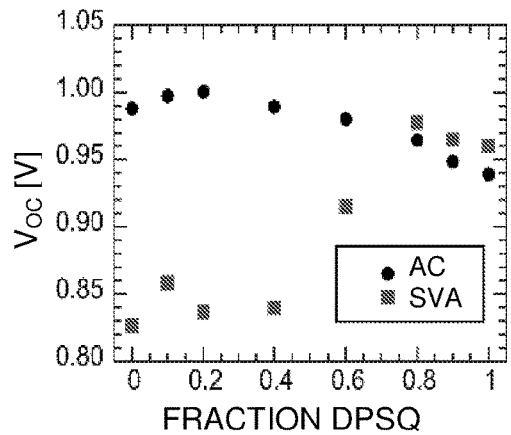
FIG. 7 shows device performance parameters for blended squaraine devices, where (a) shows $V_{OC}$, (b) shows $J_{SC}$, (c) shows fill factor (FF), and (d) shows power conversion efficiency ($\eta_P$) for devices ranging from pure DPASQ to pure DPSQ with the optimal annealing time listed in (d).
Figure 7B:
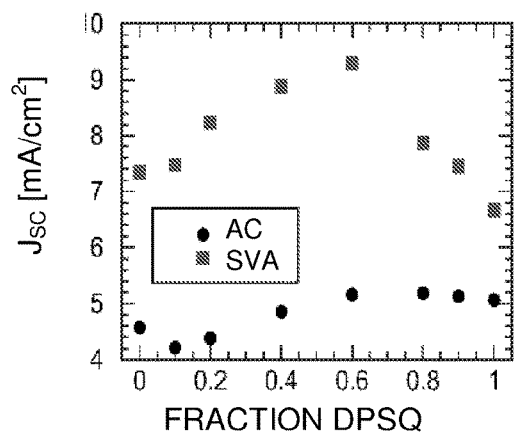
Figure 7C:
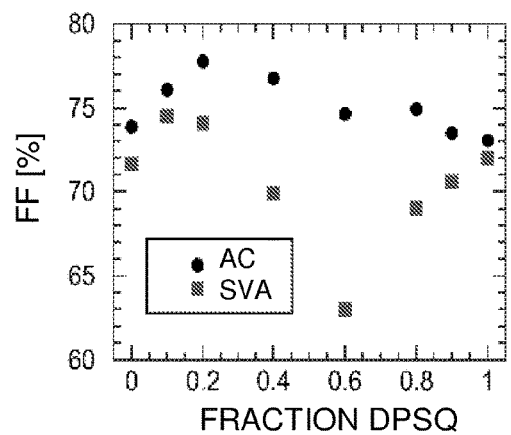
Figure 7D:
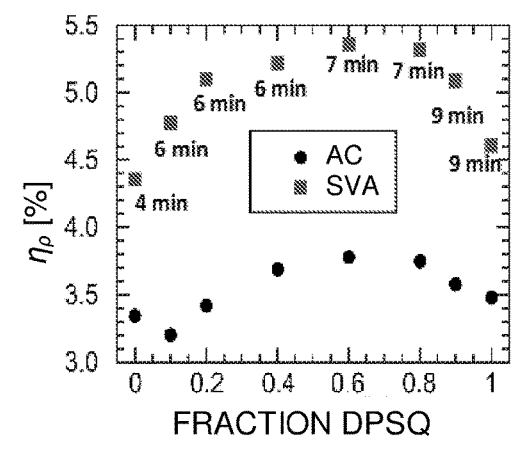

Blending of DPASQ with DPSQ affects film morphology, which in turn affects the resulting OPV efficiency. In as-cast devices, the maximum $V_{OC}$ was found for the 8:2 blend ratio (FIG. 7(a)), the maximum $J_{SC}$ was improved over a broad range of blend ratios, peaking at 4:6 DPASQ:DPSQ (FIG. 7(b)). Also, FF decreased for blends containing similar amounts of each compound (FIG. 7(c)), resulting in a broad power conversion efficiency peak for various blend ratios (FIG. 7(d)). On annealing, $J_{SC}$ increased while FF and $V_{OC}$ decreased, resulting in the optimized annealing times listed in FIG. 7(d). DPSQ suffered no appreciable decrease in $V_{OC}$ on SVA, while DPASQ junction voltages were reduced by ~0.16 V. On SVA, blends with at least 80% DPSQ had increased $V_{OC}$ compared with as-cast devices, with a maximum $V_{OC}$=0.98 V at a blend ratio of 2:8 (FIG. 7(a)). The $J_{SC}$ was maximized for a 4:6 blend (FIG. 7(b)), in agreement with the EQE trends in FIG. 4. These parameters combined to result in a maximum efficiency of $\eta_P$=5.4±0.3% for a blended squaraine composition with 4:6 DPASQ:DPSQ ($V_{OC}$=0.92±0.01 V, $J_{SC}$=9.3±0.5 mA/cm$^2$, FF=63±2%).

Example 5: Tandem Device Incorporating Solvent Vapor Annealed Blended Squaraine Films A tandem device was fabricated by combining a tetraphenyldibenzoperiflanthene (DBP) planar-mixed heterojunction (HJ) as a blue and green absorbing sub-cell, and a solution-deposited and solvent-vapor-annealed (SVA) blended squaraine (bSQ)/C70 bilayer HJ as a subcell absorbing into the near infrared (NIR), where the blend of squaraines consisted of 2,4-bis[4-(N,N-diphenylamino)-2,6-dihydroxyphenyl]squaraine (DPSQ) and 2,4-bis[4-(N,N-diphenylamino)-2,6-dihydroxyphenyl]squaraine (DPASQ). By stacking these two sub-cells, light was efficiently harvested between wavelengths of λ=350 nm and 800 nm, resulting in $\eta_P$=7.8±0.1%. The tandem $V_{OC}$ was equal to the sum of the constituent sub-cells, indicating that the transparent, compound Ag/MoO$_3$, charge recombination layer interposed between the subcells was nearly lossless.

Devices were grown on 100 nm thick layers of indium tin oxide (ITO) with a sheet resistance of 15Ω/□ pre-coated onto glass substrates. Prior to deposition, the ITO surface was cleaned in a surfactant and a series of solvents, and then exposed to ultraviolet-ozone for 10 min prior to loading into a high vacuum chamber (base pressure<10$^{-7}$ Torr) where MoO$_3$ was deposited by vacuum thermal evaporation (VTE) at ~0.1 nm/s. Substrates were transferred into a high-purity N$_2$-filled glovebox, where 16 nm thick bSQ films were spin-coated at 3000 rpm from 20 nm alumina-filtered, 1.6 mg/ml solutions in chloroform. Substrates were returned to the high vacuum chamber without exposure to air for deposition of train-sublimation-purified C$_{70}$ and a 3,4,9,10 perylenetetracarboxylic bisbenzimidazole (PTCBI) exciton blocking and electron transporting layer at a rate of 0.1 nm/s. This was followed by transfer back into the glovebox for SVA, consisting of exposure to a saturated dichloromethane vapor for 7.5 min to create the desired nanocrystalline film morphology. Next, the transparent, compound charge recombination layer consisting of a dense Ag nanoparticle layer (average thickness of 0.1 nm) and a 5 nm thick film of MoO$_3$ was deposited by VTE. For the back sub-cell (i.e. that closest to the cathode), a mixed film of DBP and C$_{70}$ was co-evaporated, where the rate of SubPc and C$_{70}$ deposition were 0.02 and 0.16 nm/s, respectively. After deposition of the 4,7-diphenyl-1,10-phenanthroline (BPhen) exciton blocking layer at 0.1 nm/s, a 100 nm-thick Ag cathode was deposited at 0.1 nm/s through a shadow mask with an array of 1 mm diameter openings. Layer thicknesses were measured with quartz crystal monitors and calibrated by variable-angle spectroscopic ellipsometry.

Current density-vs.-voltage (J-V) characteristics were measured in an ultra-pure N$_2$ ambient in the dark and under simulated AM1.5G solar illumination from a filtered 300 W Xe lamp whose intensity was varied using neutral density filters. The incident light intensity was measured using an NREL-traceable Si detector. Short-circuit currents ($J_{SC}$) of single-cell reference devices deposited concurrently with the tandem were corrected for spectral mismatch. Spectrally resolved external quantum efficiencies (EQE) were measured using monochromated light from a 150 W Xe source using output optics that focused the beam to under-fill the device area. Input intensity was calibrated with a NIST-traceable Si detector. Errors quoted correspond to the deviation from the average value of three or more devices on the same substrate.

The $J_{SC}$ of the single-cell and tandem devices were modeled using the transfer-matrix approach that includes the optical electric field intensity and exciton diffusion characteristics for each layer. The diffusion lengths of the active organic films comprising each sub-cell are inferred from the best fits to their respective EQE spectra using the optical constants for each material.

These $L_D$ values are used to calculate the $J_{SC}$ of the tandem sub-cell, whose J-V characteristic is then interpolated from the light-intensity-dependent J-V curves of the single-cell devices. This interpolation is required to estimate the current in each sub-cell at a particular illumination intensity of the full tandem stack. Finally, the tandem J-V characteristic is calculated by adding the voltages of the sub-cells at each current value, satisfying the criterion that the current must be equal among the series-connected sub-cells. Consequently, the $J_{SC}$, FF, and $V_{OC}$ are calculated for a variety of layer structures, and the optimal structure is determined for the device whose layer thicknesses result in a maximum $\eta_P$ of the tandem OPV. The spectral mismatch factor (M) for the tandem cell is calculated by taking the ratio of the calculated $\eta_P$ using the lamp and solar spectra as illumination sources. Note that a change in spectrum can result in a change in charge balance between the sub-cells, requiring the correction of both FF and $J_{SC}$ when determining M.

For the front-only device (i.e. the structure that ultimately is positioned next to the anode), the optimized bilayer double HJ has the following structure: glass substrate/100 nm ITO/20 nm MoO$_3$/16 nm bSQ/10 nm C$_{70}$/5 nm PTCBI/ 0.1 nm Ag/30 nm MoO$_3$/100 nm Ag. The 20 nm thick MoO$_3$ determines the work function of the anode. The 30 nm thick MoO$_3$ layer is used as an electron transport layer and spacer to create a similar optical field to that in the tandem device. The device has a front-cell open circuit voltage of $V_{OCF}$=0.96±0.01 V, fill factor (FF)=67±1%, $J_{SC}$=7.5±0.1 mA/cm$^2$, $\eta_P$=4.8±0.1% and M=0.97±0.01, as shown in Table I and FIG. 8 (circles). From the EQE spectrum, we calculate $L_D$=9.0±0.2 and 9.9±0.3 nm for DPSQ and C$_{70}$, respectively. The SVA process significantly increases the exciton diffusion length of bSQ due to the formation of a nanocrystalline morphology.

Figure 8:
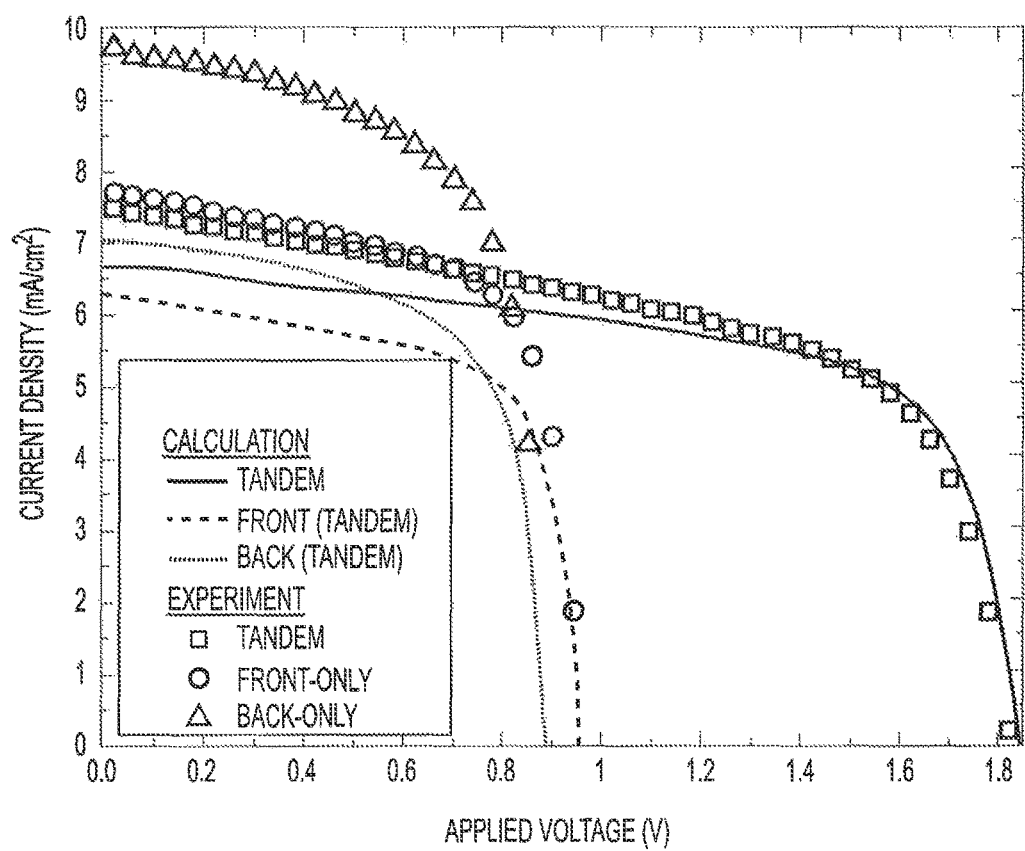
FIG. 8 shows experimental current density vs. voltage characteristics in the 4th quadrant under 1 sun, simulated AM1.5G illumination for front-only (circle), back-only (triangle), and tandem (square) organic photovoltaic cells, along with calculated characteristics for the front sub-cell (dashed), back sub-cell (dotted), and tandem (solid) cell under similar illumination conditions.

An optimized back-only cell was fabricated with the structure: glass substrate/100 nm ITO/5 nm MoO$_3$/29 nm DBP:C$_{70}$/3 nm C$_{70}$/7 nm BPhen/100 nm Ag. FIG. 8 (triangles) shows the J-V characteristics for the back-only cell, with open circuit voltage V$_{OCB}$=0.89±0.01 V, FF=61±1%, J$_{SC}$=9.4±0.1 mA/cm$_2$, η$_P$=5.0±0.1%, and M=1.03±0.01.

A tandem device was fabricated based on the optimized thicknesses: glass substrate/100 nm ITO/20 nm MoO$_3$/16 nm bSQ/10 nm C$_{70}$/5 nm PTCBI/0.1 nm Ag/5 nm MoO$_3$/29 nm DBP:C$_{70}$/3 nm C$_{70}$/7 nm BPhen/100 nm Ag. FIG. 8 shows the measured J-V characteristics (squares), with V$_{OC}$=1.83±0.01 V, FF=57±1%, J$_{SC}$=7.5±0.1 mA/cm2, ηp=7.8±0.1%, and M=0.95, as summarized in Table I. Now V$_{OC}$=V$_{OCF}$+V$_{OCB}$=1.97±0.01 V, which indicated that the internal charge recombination process was nearly lossless. However, there was a discrepancy between the slopes of the experimental and calculated currents of the individual subcells in FIG. 8 near zero bias, which was likely due to contributions from photoconductivity arising from exciton dissociation within the layer bulks, which was not considered in the model.

Figure 9:
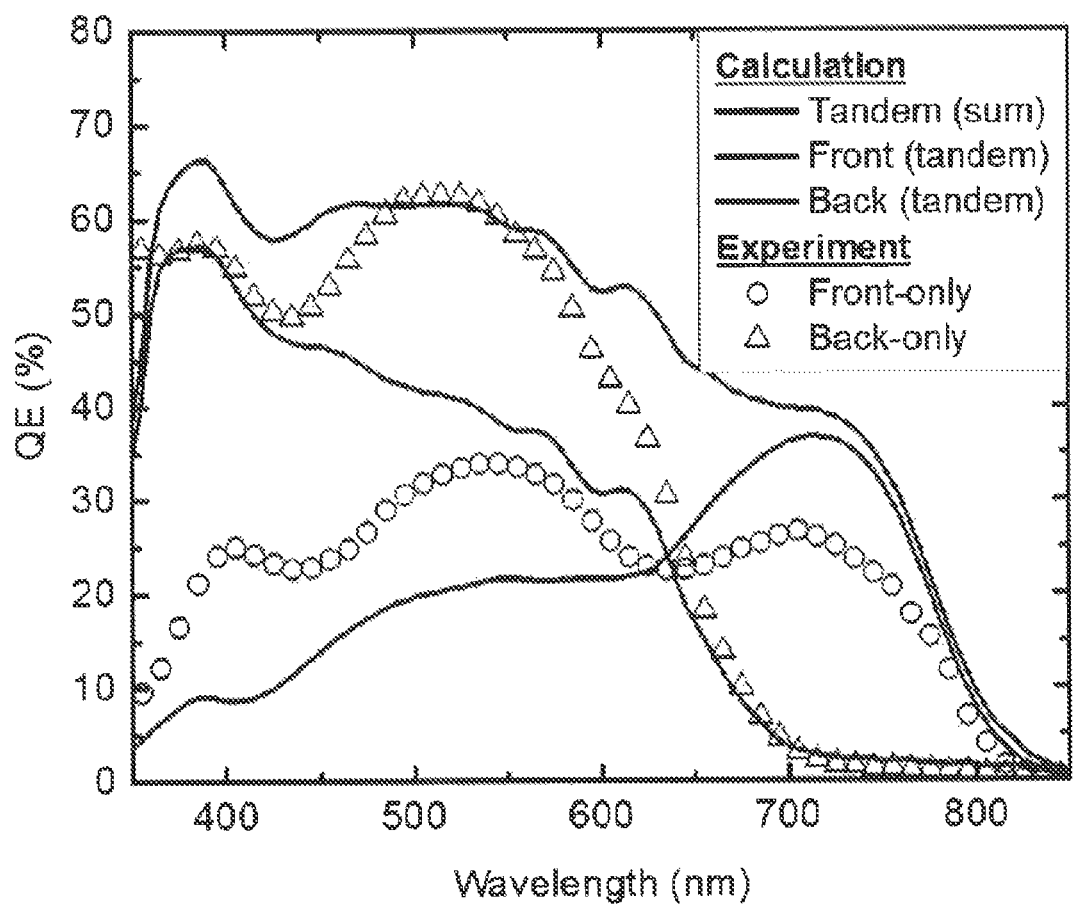
FIG. 9 shows experimental external quantum efficiency (EQE) spectra for front-only (circle) and back only (triangle) organic photovoltaic cells, along with calculated spectra for front sub-cell (dashed), back sub-cell (dotted), and the sum of the two sub-cells (solid).

The experimental and calculated EQE spectra are shown in FIG. 9. The bSQ/C$_{70}$ device was photosensitive into the NIR, with a cut-off at approximately λ=800 nm, while the DBP:C$_{70}$ subcell had EQE>50% for λ<600 nm. Overall, the tandem device harvested>60% of the photons λ<600 nm, and >40% for λ<750 nm.

TABLE I

Organic photovoltaic performance under simulated 1 sun AM1.5G illumination, corrected for spectral mismatch.

| Device | Data source | V$_{OC}$ (V) | FF (%) | J$_{SC}$ (mA/cm$^2$) | η$_P$ (%) | M |
|---|---|---|---|---|---|---|
| Back-only | Experiment | 0.89 ± 0.01 | 61 ± 1 | 9.4 ± 0.1 | 5.0 ± 0.1 | 1.03 ± 0.01 |
| Back sub-cell | Calculation | 0.88 | 64 | 7.1 | 4.0 | 1.03 |
| Front-only | Experiment | 0.96 ± 0.01 | 67 ± 1 | 7.5 ± 0.1 | 4.8 ± 0.1 | 0.97 ± 0.01 |
| Front sub-cell | Calculation | 0.94 | 66 | 6.3 | 4.0 | 0.93 |
| Tandem | Experiment | 1.83 ± 0.01 | 57 ± 1 | 7.5 ± 0.1 | 7.8 ± 0.1 | 0.95 ± 0.01 |
|  | Calculation | 1.84 | 64 | 6.7 | 7.9 | 0.95 |

Figure 5A:
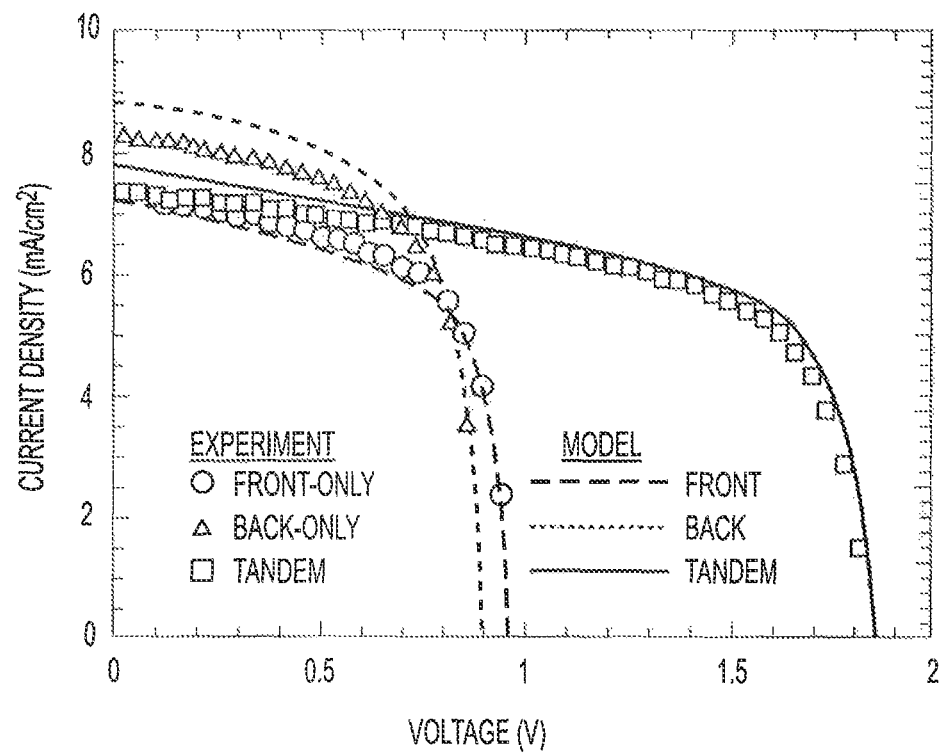
Figure 5B:
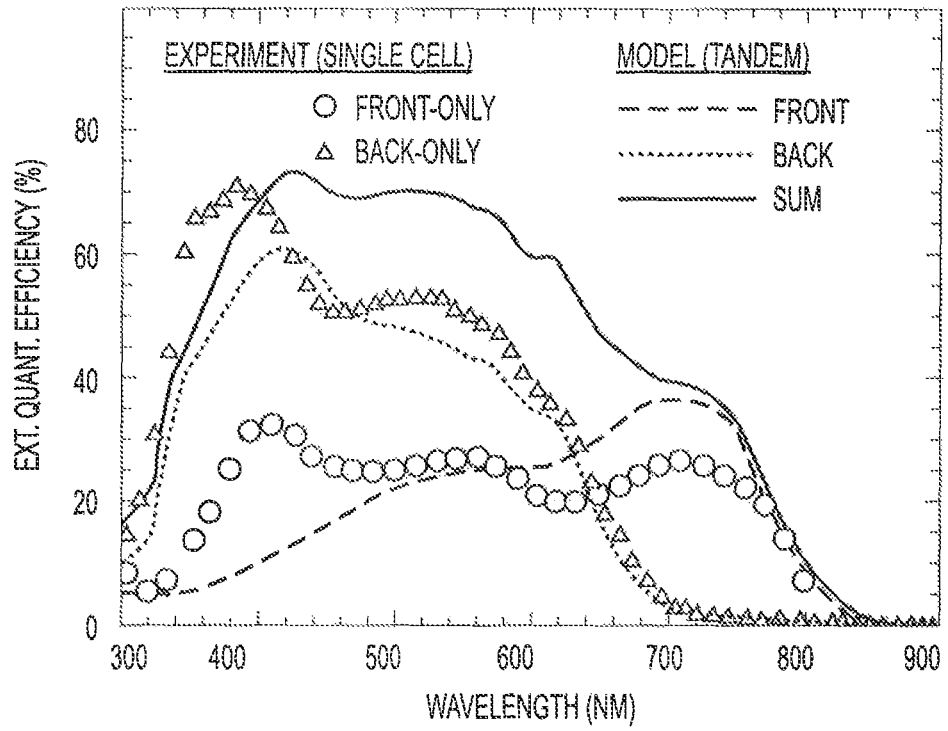

Another tandem device was fabricated with the following structure: glass substrate/100 nm ITO/20 nm MoO$_3$/16 nm 4:6 DPASQ:DPSQ/10 nm C$_{70}$/5 nm PTCBI/0.1 nm Ag/5 nm MoO$_3$/25 nm DBP:C$_{70}$/7 nm C$_{70}$/7 nm bathophenanthroline (BPhen)/100 nm Ag. The tandem cell was fabricated following previously described methods, where the back sub-cell (that closest to the Ag cathode contact) employs an active layer comprising co-evaporated tetraphenyldibenzoperiflanthene DBP:C$_{70}$ (1:8 vol. ratio), and the front sub-cell (closest to the ITO anode) consists of a SVA blended squaraine (4:6 DPSQ:DPASQ)/C70 bulk heterojunction. FIG. 5(a) shows the measured J-V characteristics for both the discrete cells (circles and triangles), and the tandem device (squares), with V$_{OC}$=1.85±0.01 V, FF=61±1%, J$_{SC}$=7.4±0.4 mA/cm$^2$, and η$_P$=8.3±0.4%. The lines in FIG. 5(b) show the calculated EQE for each subcell as it behaves in the tandem (dashed line for the blended squaraine cell, dotted line for the DBP:C$_{70}$ cell) and the sum of the EQEs of the sub-cells (solid line) showing the overall percent of photons contributing to current in the tandem OPV. The tandem cell harvests>60% of the photons at λ<600 nm, and >40% at λ<750 nm.

What is claimed is:

1. A method for fabricating an organic photovoltaic device comprising:

depositing an amorphous organic layer and a crystalline organic layer over a first electrode, wherein the amorphous organic layer and the crystalline organic layer contact one another at an interface;

annealing the amorphous organic layer and the crystalline organic layer for a time sufficient to induce at least partial crystallinity in the amorphous organic layer; and depositing a second electrode over the amorphous organic layer and the crystalline organic layer; and wherein the amorphous organic layer comprises at least one material that undergoes inverse-quasi epitaxial (IQE) alignment to a material of the crystalline organic layer as a result of the annealing.

2. The method of claim 1, wherein the annealing is chosen from solvent vapor annealing and thermal annealing.

3. The method of claim 1, wherein the amorphous organic layer and the crystalline organic layer comprise different small molecule materials.

4. The method of claim 1, wherein the at least one material that undergoes IQE alignment is a donor or an acceptor relative to the material of the crystalline organic layer.

5. The method of claim 4, wherein the at least one material that undergoes IQE is a donor relative to the material of the crystalline organic layer, and the material of the crystalline organic layer comprises a fullerene or a derivative thereof.

6. The method of claim 1, wherein the at least one material that undergoes IQE alignment is a donor relative to the material of the crystalline organic layer, wherein the at least one material comprises a squaraine or derivative thereof.

7. The method of claim 1, wherein the at least one material that undergoes IQE alignment exhibits a lattice mismatch to a material of the crystalline organic layer in at least one crystal direction and crystal dimension of less than 10%, upon crystallization.

8. The method of claim 1, wherein the at least one material that undergoes IQE alignment exhibits a lattice mismatch to a material of the crystalline organic layer in at least one crystal direction and crystal dimension of less than 5%, upon crystallization.

9. The method of claim 1, wherein the amorphous organic layer further comprises at least one material that does not undergo IQE alignment to the material of the crystalline organic layer as a result of the annealing.

10. The method of claim 9, wherein the at least one material that undergoes IQE alignment and the at least one material that does not undergo IQE alignment are donors or acceptors relative to the material of the crystalline organic layer.

11. The method of claim 1, further comprising depositing a buffer layer over the amorphous organic layer and the crystalline organic layer before annealing such that the buffer layer is also exposed to the annealing.

12. The method of claim 1, wherein the amorphous organic layer and the crystalline organic layer are deposited using different deposition techniques.

13. The method of claim 12, wherein the amorphous organic layer is deposited using a solution processing technique and the crystalline organic layer is deposited using a vacuum deposition technique.

14. A method of intermixing materials at an interface, comprising:
   providing a film comprising an amorphous organic layer and a crystalline organic layer disposed over a substrate, wherein the amorphous organic layer contacts the crystalline organic layer at the interface; and
   annealing the amorphous organic layer and the crystalline organic layer; wherein the amorphous organic layer comprises at least one material that undergoes IQE alignment to a material of the crystalline organic layer as a result of the annealing.

15. The method of claim 14, wherein the annealing is chosen from solvent vapor annealing and thermal annealing.

16. The method of claim 14, wherein providing a film comprising an amorphous organic layer and a crystalline organic layer disposed over a substrate comprises depositing an amorphous organic layer and a crystalline organic layer over the substrate, wherein the amorphous organic layer and the crystalline organic layer are deposited using different techniques.

17. The method of claim 16, wherein the amorphous organic layer is deposited using a solution processing technique and the crystalline organic layer is deposited using a vacuum deposition technique.

18. The method of claim 14, wherein the amorphous organic layer comprises a donor material or an acceptor material relative to a material of the crystalline organic layer.

19. The method of claim 14, wherein the at least one material that undergoes IQE alignment is a donor or an acceptor relative to the material of the crystalline organic layer.

20. The method of claim 19, wherein the at least one material that undergoes IQE alignment is a donor relative to the material of the crystalline organic layer, and the material of the crystalline organic layer comprises a fullerene or a derivative thereof.

21. The method of claim 14, wherein the amorphous organic layer further comprises at least one material that does not undergo IQE alignment to the material of the crystalline organic layer as a result of the annealing.

22. The method of claim 21, wherein the at least one material that undergoes IQE alignment and the at least one material that does not undergo IQE alignment are both donors or both acceptors relative to the material of the crystalline organic layer.

23. The method of claim 14, wherein the film further comprises a buffer layer over the amorphous organic layer and the crystalline organic layer such that the buffer layer is also exposed to the annealing.

24. An organic photovoltaic device comprising:
   two electrodes in superposed relation; and
   a photoactive region positioned between the two electrodes, wherein the photoactive region comprises a donor layer and an acceptor layer forming a donor-acceptor heterojunction, wherein one of the donor layer and the acceptor layer is a crystalline layer and the other of the donor layer and the acceptor layer comprises at least one material that has undergone IQE alignment to a material of the crystalline layer.

25. The device of claim 24, wherein the donor layer and the acceptor layer are annealed.

26. The device of claim 25, wherein the annealing is chosen from solvent vapor annealing and thermal annealing.

27. The device of claim 24, wherein the layer that comprises the at least one material that has undergone IQE alignment further comprises at least one material that has not undergone IQE alignment to the material of the crystalline layer.

28. The device of claim 24, wherein the at least one material that has undergone IQE alignment comprises a squaraine or derivative thereof.

29. The device of claim 24, wherein the material of the crystalline layer is a fullerene or derivative thereof.

* * * * *